US012672332B2

(12) United States Patent
Chen

(10) Patent No.: US 12,672,332 B2
(45) Date of Patent: Jun. 30, 2026

(54) LDMOS DEVICE AND METHOD OF FABRICATION OF SAME

(71) Applicant: TEXAS INSTRUMENTS INCORPORATED, Dallas, TX (US)

(72) Inventor: Jingjing Chen, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 571 days.

(21) Appl. No.: 18/072,515

(22) Filed: Nov. 30, 2022

(65) Prior Publication Data

US 2024/0178283 A1    May 30, 2024

(51) Int. Cl.
| | |
|---|---|
| *H01L 29/40* | (2006.01) |
| *H10D 30/01* | (2025.01) |
| *H10D 30/65* | (2025.01) |
| *H10D 62/10* | (2025.01) |
| *H10D 62/17* | (2025.01) |
| *H10D 64/00* | (2025.01) |
| *H10D 64/01* | (2025.01) |

(52) U.S. Cl.
CPC ....... *H10D 64/111* (2025.01); *H10D 30/0281* (2025.01); *H10D 30/65* (2025.01); *H10D 62/116* (2025.01); *H10D 62/393* (2025.01); *H10D 64/01* (2025.01)

(58) Field of Classification Search
None
See application file for complete search history.

(56) References Cited

U.S. PATENT DOCUMENTS

| | | | |
|---|---|---|---|
| 2010/0140697 A1* | 6/2010 | Yedinak | H10D 62/126 257/334 |
| 2022/0271158 A1* | 8/2022 | Kocon | H10D 62/82 |

* cited by examiner

*Primary Examiner* — William C Trapanese
(74) *Attorney, Agent, or Firm* — Andrew R. Ralston; Frank D. Cimino

(57) ABSTRACT
An LDMOS device includes a semiconductor substrate with an epitaxial layer that comprises a body region and a drain drift region. A drain region is formed in the drain drift region and a source region is formed in the body region. A gate shield may be formed over a gate shield dielectric layer disposed over a gate electrode, the gate shield having a variable length and tied to the source that is provided with a body connection via a deep trench contact.

30 Claims, 19 Drawing Sheets

LOCOS OXIDATION

135 GATE DIELECTRIC OXIDATION

137 GATE ELECTRODE POLYSILICON REAGENT

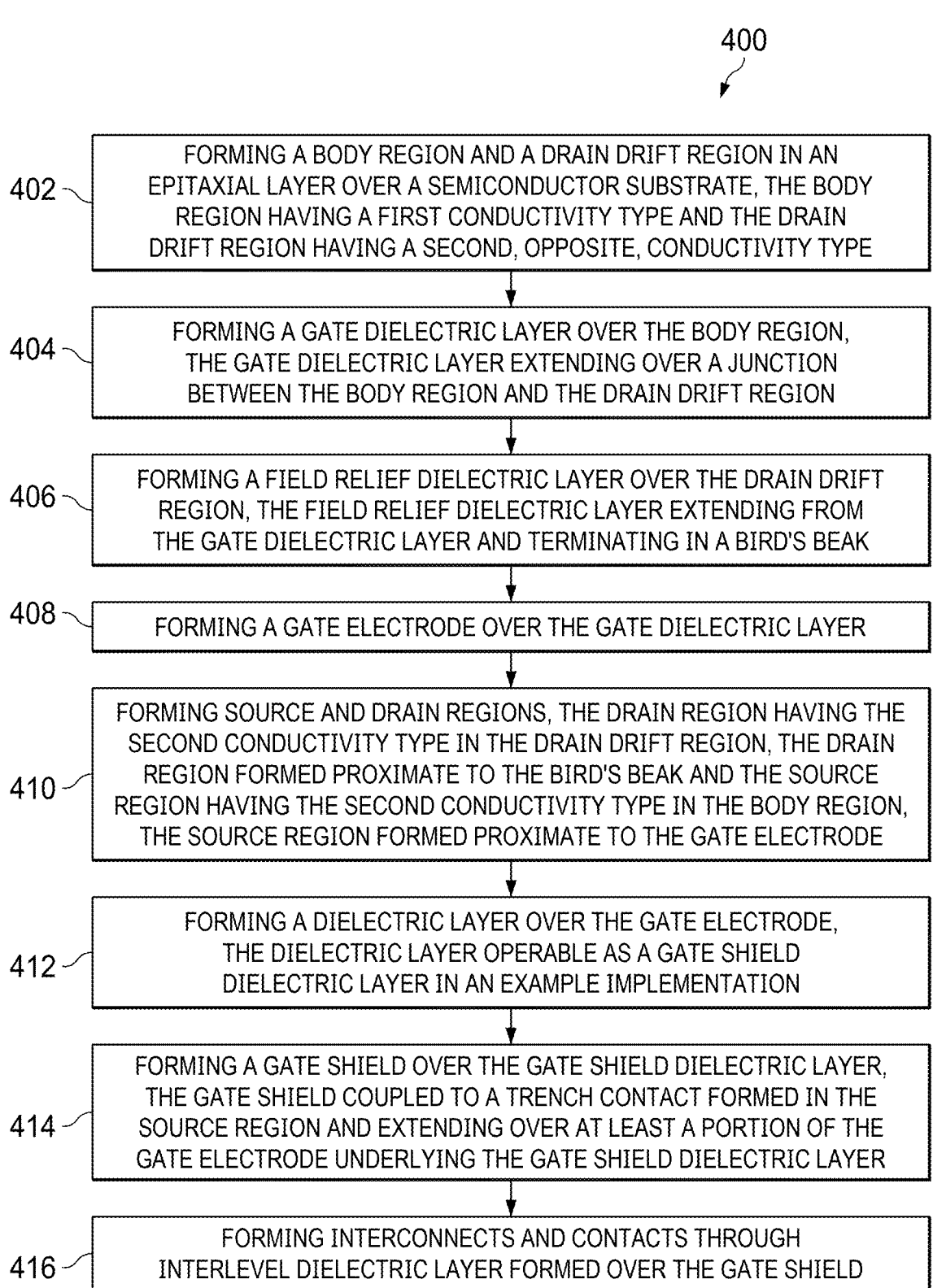

400

402 — FORMING A BODY REGION AND A DRAIN DRIFT REGION IN AN EPITAXIAL LAYER OVER A SEMICONDUCTOR SUBSTRATE, THE BODY REGION HAVING A FIRST CONDUCTIVITY TYPE AND THE DRAIN DRIFT REGION HAVING A SECOND, OPPOSITE, CONDUCTIVITY TYPE

404 — FORMING A GATE DIELECTRIC LAYER OVER THE BODY REGION, THE GATE DIELECTRIC LAYER EXTENDING OVER A JUNCTION BETWEEN THE BODY REGION AND THE DRAIN DRIFT REGION

406 — FORMING A FIELD RELIEF DIELECTRIC LAYER OVER THE DRAIN DRIFT REGION, THE FIELD RELIEF DIELECTRIC LAYER EXTENDING FROM THE GATE DIELECTRIC LAYER AND TERMINATING IN A BIRD'S BEAK

408 — FORMING A GATE ELECTRODE OVER THE GATE DIELECTRIC LAYER

410 — FORMING SOURCE AND DRAIN REGIONS, THE DRAIN REGION HAVING THE SECOND CONDUCTIVITY TYPE IN THE DRAIN DRIFT REGION, THE DRAIN REGION FORMED PROXIMATE TO THE BIRD'S BEAK AND THE SOURCE REGION HAVING THE SECOND CONDUCTIVITY TYPE IN THE BODY REGION, THE SOURCE REGION FORMED PROXIMATE TO THE GATE ELECTRODE

412 — FORMING A DIELECTRIC LAYER OVER THE GATE ELECTRODE, THE DIELECTRIC LAYER OPERABLE AS A GATE SHIELD DIELECTRIC LAYER IN AN EXAMPLE IMPLEMENTATION

414 — FORMING A GATE SHIELD OVER THE GATE SHIELD DIELECTRIC LAYER, THE GATE SHIELD COUPLED TO A TRENCH CONTACT FORMED IN THE SOURCE REGION AND EXTENDING OVER AT LEAST A PORTION OF THE GATE ELECTRODE UNDERLYING THE GATE SHIELD DIELECTRIC LAYER

416 — FORMING INTERCONNECTS AND CONTACTS THROUGH INTERLEVEL DIELECTRIC LAYER FORMED OVER THE GATE SHIELD

|  | BV (V) | Rsp (mOhm.mm2) | Vth (V) | Vsnap@Vg=5 (V) |
|---|---|---|---|---|
| BASELINE LDMOS | 51.8 | 11.75 | 1.39 | 34.2 |
| EXAMPLE LDMOS OF THE PRESENT DISCLOSURE | 52.1 | 11.7 | 1.39 | 38 |

506    508    510    512

502    504

600

LDMOS DEVICE AND METHOD OF FABRICATION OF SAME

FIELD OF THE DISCLOSURE

Disclosed implementations relate generally to the field of semiconductor devices and fabrication. More particularly, but not exclusively, the disclosed implementations relate to laterally diffused metal oxide semiconductor (LDMOS) devices.

BACKGROUND

As DC-DC converters are scaled to the next generation of power converter products, there is a desire to improve performance, decrease die size, and increase the safe operating area (SOA) of the constituent integrated power FET devices such as LDMOS devices. Increasing the SOA of the semiconductor device is a method to improve the overall ruggedness of the device. Further, improvements in the switching frequency of the LDMOS devices are also being pursued for purposes of various power amplifier applications.

SUMMARY

The following presents a simplified summary in order to provide a basic understanding of some examples of the present disclosure. This summary is not an extensive overview of the examples, and is neither intended to identify key or critical elements of the examples, nor to delineate the scope thereof. Rather, the primary purpose of the summary is to present some concepts of the present disclosure in a simplified form as a prelude to a more detailed description that is presented in subsequent sections further below.

Examples of the present disclosure are directed to an LDMOS device having a deep trench contact and associated optional source-coupled gate shield as well as a method of fabricating the same.

In one example, a semiconductor device including an LDMOS is disclosed. The semiconductor device comprises, inter alia, a semiconductor substrate including an epitaxial layer, the epitaxial layer including a body region having a first conductivity type and a drain drift region having a second, opposite, conductivity type. A gate dielectric layer is disposed over the body region, which may extend over a junction between the body region and the drain drift region. A gate electrode is disposed over the gate dielectric layer. A drain region having the second conductivity type is disposed in the drain drift region. A field relief dielectric layer is disposed over the drain drift region, wherein the field relief dielectric layer extends from the gate dielectric layer toward the drain region. A source region having the second conductivity type is disposed in the body region, generally proximate to the gate electrode. A gate shield dielectric layer is disposed over the gate electrode. A gate shield is disposed over the gate shield dielectric layer, wherein the gate shield is coupled to a trench contact formed in and/or electrically contacting the source region, the gate shield extending over at least a portion of the gate electrode. In one arrangement, the gate shield may be optional and may have a variable length overlying the dielectric layer.

In another example, a method of fabricating a semiconductor device including an LDMOS is disclosed. The method comprises, inter alia, forming a body region and a drain drift region in an epitaxial layer of a semiconductor substrate, the body region having a first conductivity type and the drain drift region having a second, opposite, conductivity type. The method may include forming a gate dielectric layer over the body region, the gate dielectric layer extending over a junction between the body region and the drain drift region. The method may include forming a field relief dielectric layer over the drain drift region, wherein the field relief dielectric layer may extend from the gate dielectric layer and terminate in a tapered end, e.g., a bird's beak. The method may include forming a gate electrode over the gate dielectric layer. The method may include forming a drain region having the second conductivity type in the drain drift region, the drain region formed proximate to the bird's beak. The method may include forming a source region having the second conductivity type in the body region, the source region formed proximate to the gate electrode. The method may include forming a dielectric layer over the gate electrode. In one arrangement, the dielectric layer may comprise an oxide layer and may be operable as a gate shield dielectric layer. The method may include forming a gate shield over the gate shield dielectric layer. In one arrangement, the gate shield may be coupled to a trench contact formed in and/or electrically contacting the source region, wherein the gate shield may extend over at least a portion of the gate electrode.

BRIEF DESCRIPTION OF THE DRAWINGS

Implementations of the present disclosure are illustrated by way of example, and not by way of limitation, in the Figures of the accompanying drawings. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

FIGS. 1A-1J depict cross-sectional views of a partially formed semiconductor device at various stages of fabrication according to some examples of the present disclosure;

FIG. 4 is a flow chart of a method of fabricating a semiconductor device according to some examples of the present disclosure.

DETAILED DESCRIPTION

Figures 1A, 1B:
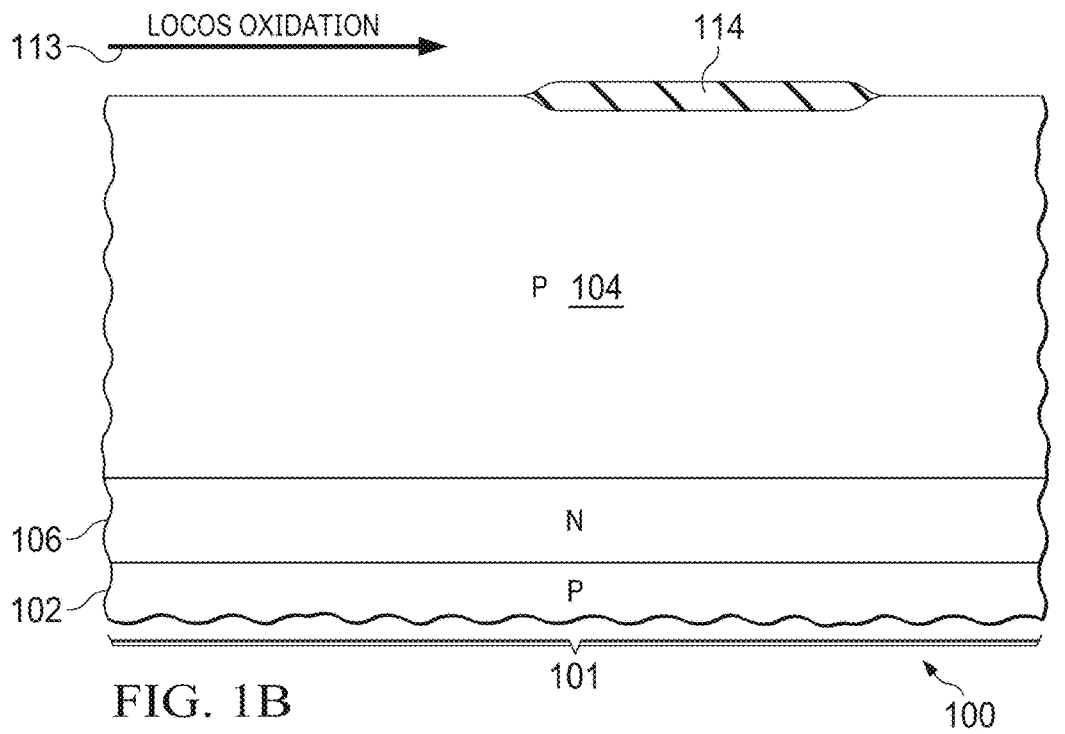

Examples of the disclosure are described with reference to the attached Figures wherein like reference numerals are generally utilized to refer to like elements. The Figures are not drawn to scale and they are provided merely to illustrate examples. Numerous specific details, relationships, and methods are set forth below to provide an understanding of one or more examples. However, it should be understood that some examples may be practiced without such specific details. In other instances, well-known subsystems, components, structures and techniques have not been shown in detail in order not to obscure the understanding of the examples. Accordingly, it will be appreciated by one skilled in the art that the examples of the present disclosure may be practiced without such specific components.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, between two or more elements that are coupled with each other. "Directly connected" may be used to convey that two or more physical features touch, or share an interface between each other.

Drain extended transistors may include drain-extended NMOS (DENMOS), drain-extended PMOS (DEPMOS), and/or laterally diffused MOS (LDMOS) transistors, as well as groups of DENMOS and DEPMOS, referred to as complimentary drain extended MOS or DECMOS transistors. Described examples may include doped regions of various semiconductor structures which may be characterized as P-doped and/or N-doped regions or portions, and may include regions that have majority carrier dopants of a particular type, such as N-type dopants or P-type dopants.

Without limitation, examples of the disclosure will be set forth below in the context of an LDMOS device having one or more optional features as will be noted in the disclosure.

FIGS. 1A-1J depict cross-sectional views of a partially formed semiconductor device 100 at various stages of fabrication according to some examples of the present disclosure. In one arrangement, the exemplified fabrication stages are representative of the stages of forming an intermediary product on a semiconductor process wafer that may be further processed for fabricating a device having a source-tied gate shield in an N-channel LDMOS transistor 101 according to an example implementation. It will be recognized that although NMOS LDMOS transistors 101 are described herein, P-channel (PMOS) LDMOS transistors can also be formed in additional and/or alternative implementations wherein N-doped regions or regions of a first conductivity type are substituted by P-doped regions or regions of a second conductivity type. Likewise, P-doped regions or regions of the second conductivity type are substituted by N-doped regions.

Referring to FIG. 1A in particular, example semiconductor device 100 is shown at the point in the process flow where a suitable semiconductor substrate including an epitaxial layer having appropriate doping has been formed. For example, a lightly doped P-type epitaxial (EPI) layer 104 may be grown or otherwise formed on or in a P-type substrate 102. In some implementations, an N-type buried layer (NBL) 106 may be formed under the EPI layer 104, which may formed using a suitable fabrication technique, e.g., by dopant implantation. As will become apparent in the ensuing discussion, at least a portion of the EPI layer 104 may serve as a body of the LDMOS transistor 101, and sometimes may be referred to for convenience or clarity as a body region 104 comprising a portion of the EPI layer but excluding the source and drain regions that may be formed in the EPI layer for the fabrication of LDMOS 101 as will be set forth further below. While the NBL 106 is shown in FIG. 1A, it should be appreciated that an NBL can be optional for fabricating a LDMOS device according to some examples of the present disclosure. The P-type substrate 102 and the EPI layer (including the body region) 104 may both comprise silicon, in addition to other suitable materials or impurities in some examples. A pad oxide (PADOX) layer 108 of silicon dioxide may be formed on the EPI layer 104. The pad oxide layer 108 may include silicon dioxide that is formed by a thermal oxidation process or a chemical vapor deposition (CVD) process. In some arrangements, the pad oxide layer 108 may be fabricated with appropriate dimensions and/or constituent materials in order to provide stress relief between the EPI layer 104 and subsequent layers. By way of example, the pad oxide layer 108 may have a thickness of 5 nm to 50 nm.

In one example implementation, a silicon nitride layer 109 may be deposited over the pad oxide layer 108, over which a patterned photomask 110 may be formed. The photomask 110 serves the function of masking the underlying layers and may include a light sensitive organic material (e.g., a photoresist) that is coated, exposed and developed. The photomask 110 step is followed by a plasma etch process 111 that removes the underlying layers 108/109 in the exposed openings of the patterned photoresist 100, whereby a region 112 is exposed in the EPI layer 104 that will eventually form a field relief dielectric layer, e.g., dielectric layer 114 shown in FIG. 1B. Whereas the field relief dielectric layer 114 may be formed in an example by way of a local oxidation of silicon (LOCOS) process for forming a layer of silicon dioxide with tapered ends as illustrated in FIG. 1B, other isolation techniques or processes may also be used, e.g., shallow trench isolation (STI) or box isolation, in additional and/or alternative implementations.

Continuing to refer to FIG. 1B, the semiconductor device 100 is shown therein after a furnace oxidation 113 to form the field relief dielectric layer 114 and after a wet chemical removal (not shown) of the layers 108 and 109 according to an example. Depending on implementation, the LOCOS field relief dielectric layer 114 may have a thickness in a range between 50 nm and 150 nm. Dielectric features such as the field relief dielectric layer 114 fabricated using LOCOS type processing may have tapered ends, e.g., thinner near their perimeter, generally known in the art as a "bird's beak" where the field relief dielectric layer 114 meets a top surface of the EPI layer 104.

Figure 1C:
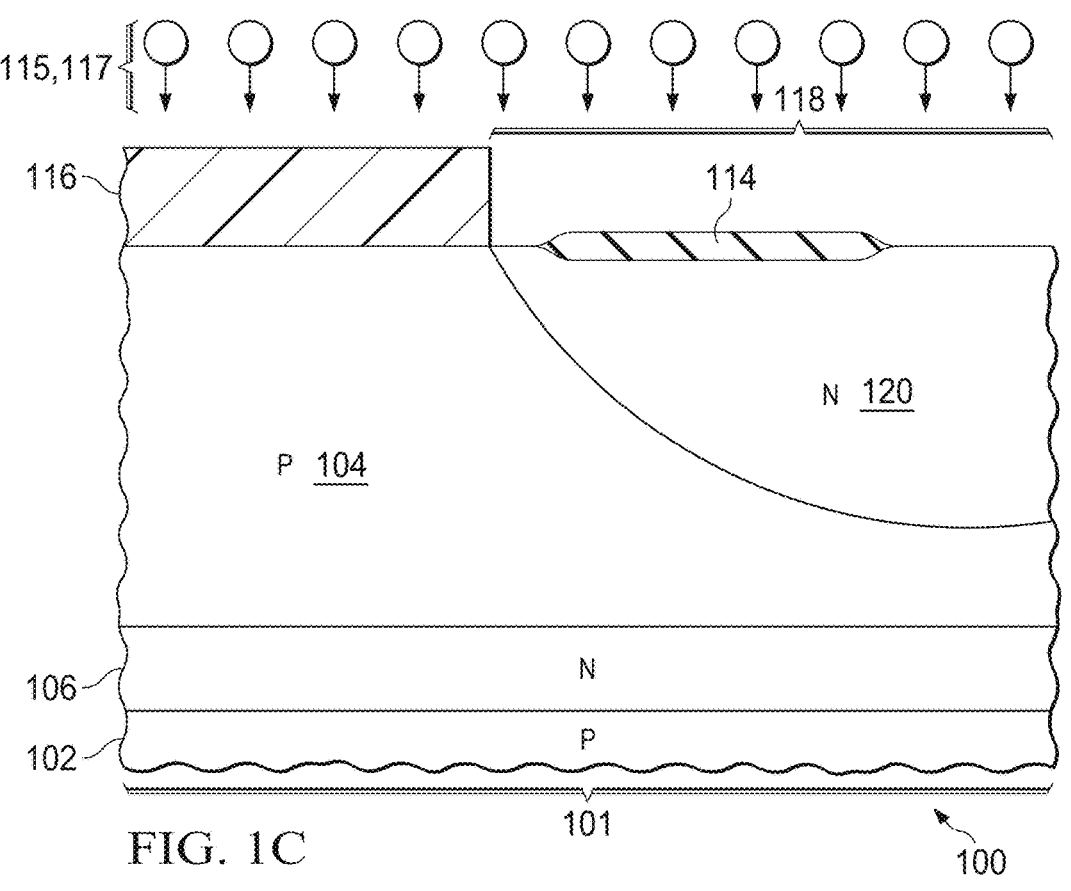

Referring to FIG. 1C, a photomask 116 is deposited and patterned with an opening corresponding to a region 118 (e.g., encompassing the field relief dielectric layer feature 114) where a drift region implant is to be implanted to form a drift region in the EPI layer 104. In an example, the drift region implant may comprise NDRIFT implant for forming an NDRIFT drain drift region 120 within the exposed areas of the EPI layer 104. In an example, the implant to define the NDRIFT region may occur in two steps. In one implementation, an initial implantation process 115 implants phosphorous dopants having a first dose of 2 to $8\times10^{12}$ cm$^{-2}$ and at a first energy of 20 to 40 kilo-electron volts (keV). In one example, the first implantation process 115 may be configured to implant phosphorus dopants in region 118 at the first energy of 20-40 keV for a relief oxide thickness of 70-110 nm. In another example, the first dose is 2 to $5\times10^{12}$ cm$^{-2}$.

A second implant process 117 may use the same photomask 116 to implant the same region 118. In one example, the implant energy level used in the second implant process 117 may be greater than the first implant energy level of the first implant process 115. In one example, the second implantation process 117 may be configured to implant phosphorus dopants having a second dose of 2 to $5 \times 10^{12}$ cm$^{-2}$ at a second energy of 70-350 keV. In one example, the second implantation process 117 implants phosphorus dopants at the second energy level ≤ 150 keV. In one example, the second implantation process 117 implants phosphorus dopants at the second energy ≥ 100 keV, such as 100-350 keV. In one example, the second implantation process 117 may include more than one implant, for example, an implantation at 120 keV, and another implantation at 250 keV.

Figure 1D:
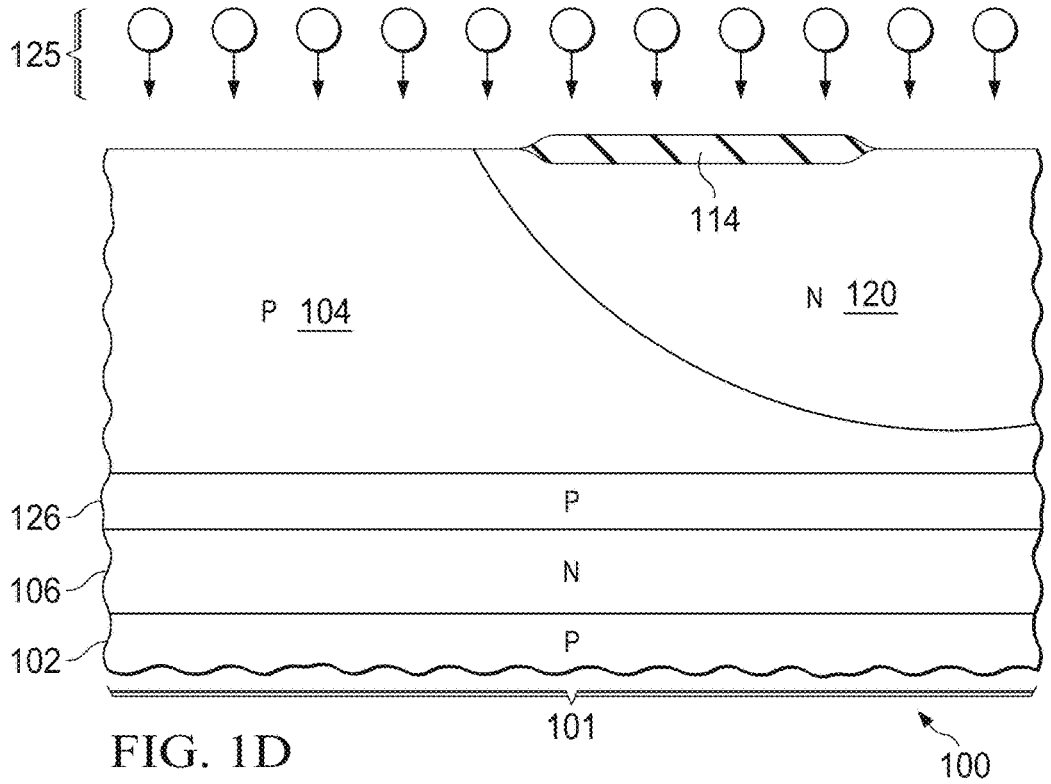

Turning to FIG. 1D, a P-type buried layer (PBL) 126 may be formed using a high energy P-type implant (PBL implant) 125 to add doping to the P-type EPI layer 104 in an example implementation. The PBL implant 125 may comprise boron at a dose in the range of $1 \times 10^{12}$ cm$^{-2}$ to $1 \times 10^{13}$ cm$^{-2}$ at an energy of 400 keV to 3 mega-electron volts (MeV). Indium may also be used as the implant species in some examples. For low voltage (e.g., 20 V) versions of the LDMOS transistor 101, the PBL implant 125 can be a blanket implant, while for higher voltage (e.g., >30 V) versions of the LDMOS transistor 101, the PBL implant 125 can be a masked implant to allow selective placement. For the masked implant, a photomask (not specifically shown) may be deposited and patterned with an opening which exposes regions of the EPI 104 where the PBL implant 125 is to be implanted. The PBL implant 125 may be followed by a thermal drive (not specifically shown) which extends the PBL implant 125 below the drift region 120. Depending on implementation, a dedicated thermal drive may be optionally provided, as the activation of the PBL implant 125 may also be done during the same damage anneal process as may be used after SNWELL (shallow N-well) and/or SPWELL (shallow P-well) implants (described below) in some process flows.

Figures 1E, 1F:
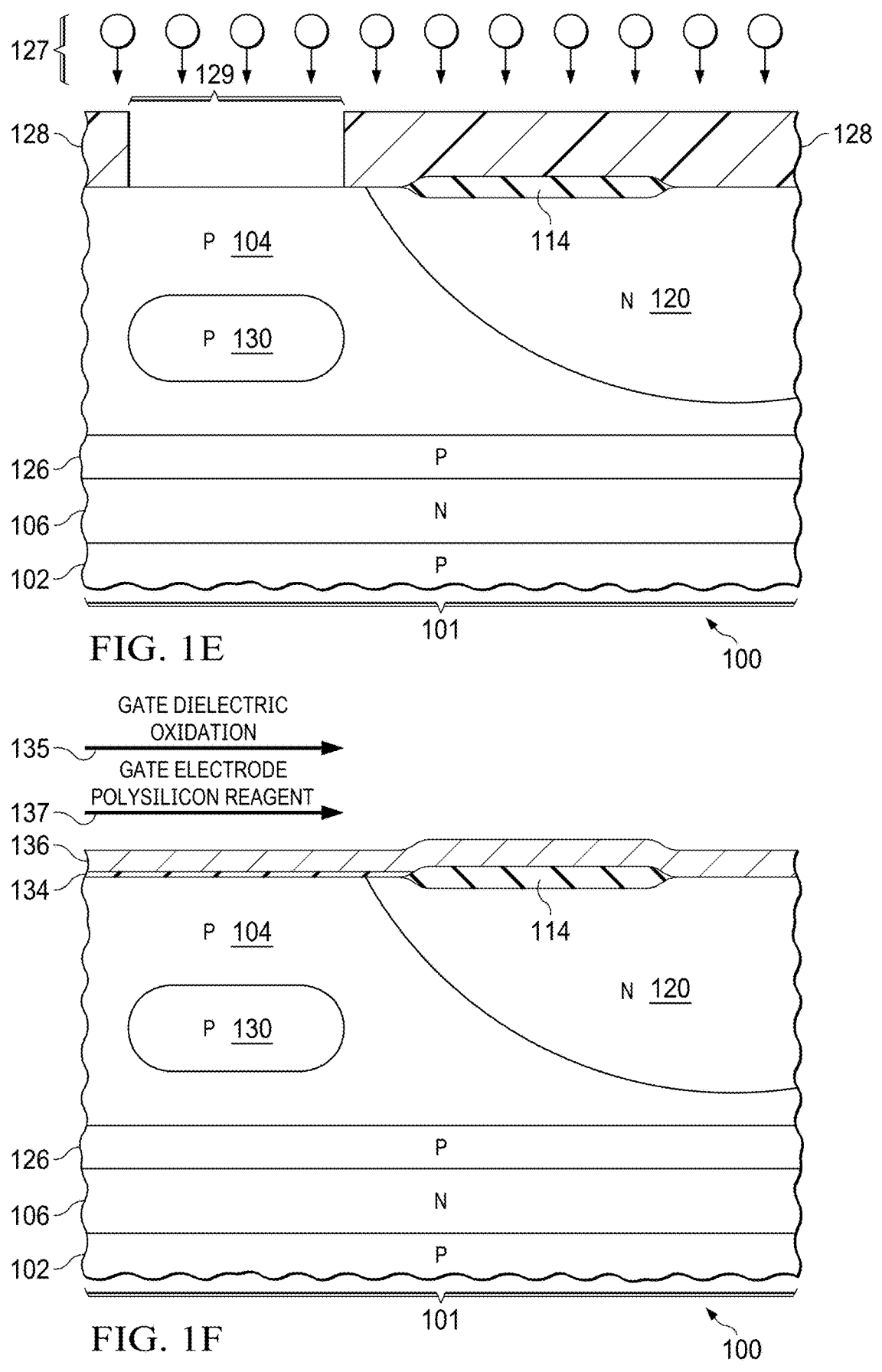

Referring to FIG. 1E, a photomask 128 is deposited and patterned with an opening 129 corresponding to a region defining an SPWELL 130 in the EPI layer 104. Depending on implementation, SPWELL 130 may be formed under a P-type deep well (DWELL) region 146 shown in FIG. 1H. In some examples, the formation of DWELL regions may be optional. An SPWELL ion implantation 127 may be configured to implant P-type dopants within the exposed areas of the EPI layer 104 to form SPWELL 130. In an example implementation, the SPWELL ion implantation 127 may comprise two or more SPWELL implants, which may be at different energies. In some implementations, body region doping provided by SPWELL 130 is operable to increase a base doping level to suppress a parasitic lateral NPN bipolar junction transistor formed by N+ source-P-body-N+ drain, which may be further suppressed by additional trench contact processing in the fabrication of a source-tied gate shield as will be set forth further below. Because the parasitic NPN transistor generally operates to limit high current operation of the LDMOS transistor, some examples herein may therefore be advantageously configured to provide additional suppression of the parasitic NPN effects in order to improve the safe operating area (SOA) of an LDMOS device which may be defined by a high current/voltage operation boundary.

Figures 1G, 1H:
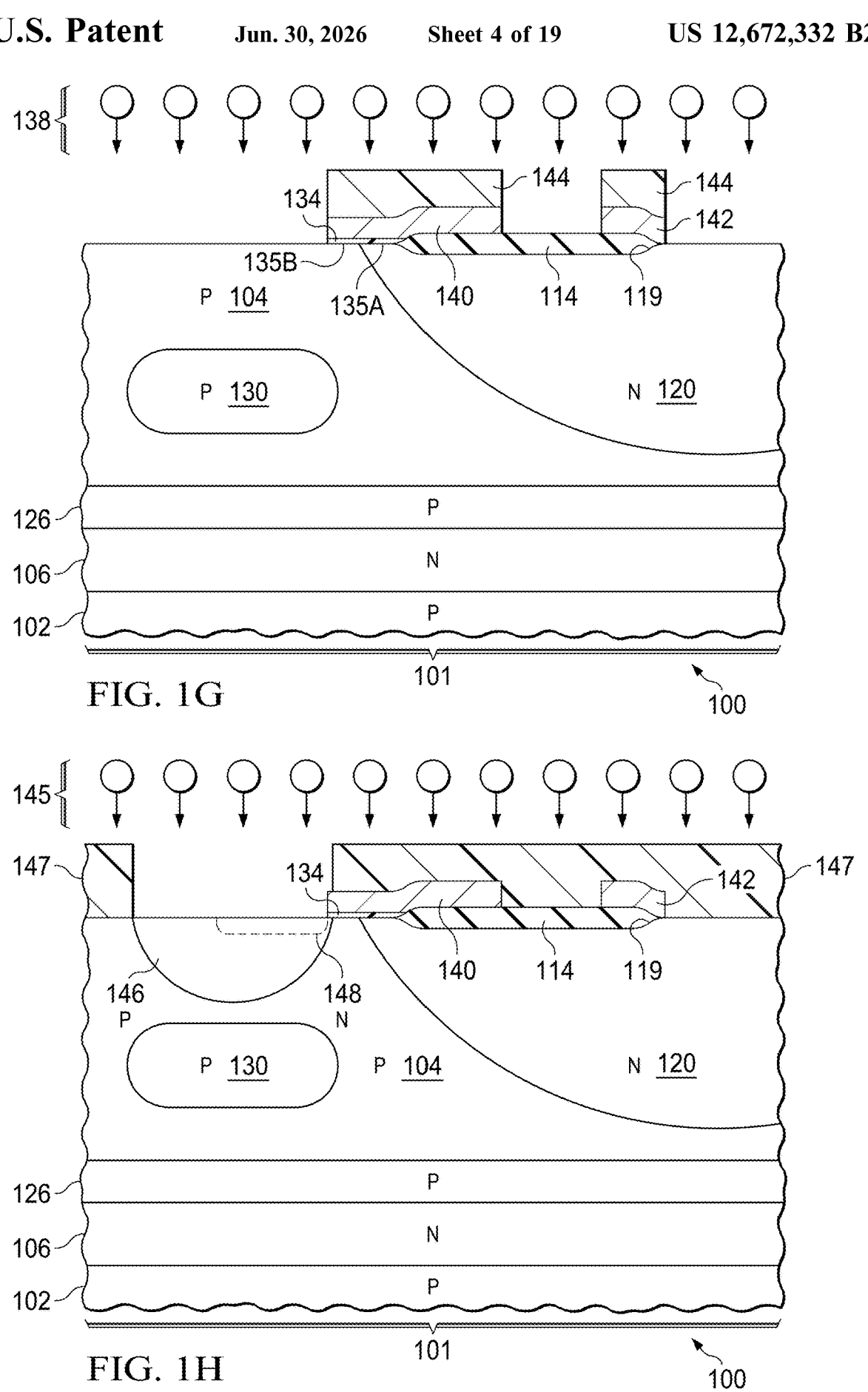

Referring to FIG. 1F, a gate dielectric layer 134 may be formed in a high temperature furnace operation or a rapid thermal process 135 depending on implementation. In an example arrangement, the gate dielectric layer 134 may have a thickness ranging from approximately 3 nm to 15 nm for silicon dioxide (SiO). Where silicon oxynitride (SiON) is used gate dielectric material, the gate dielectric layer 134 may be slightly thinner but with a higher dielectric constant than that of silicon dioxide, which is about 3.9, by way of illustration. After the gate dielectric layer 134 is formed, a gate electrode layer 136 is deposited by a gate deposition process 137 using any of a number of silane based precursors in an example implementation. Whereas polycrystalline silicon (polysilicon) may be provided as one example of a material for forming the gate electrode layer 136, a metal gate or CMOS-based replacement gate electrode process can also be used to provide the gate electrode layer 136 in additional and/or alternative variations. As illustrated in FIG. 1F, the gate electrode layer 136 in this particular example is comprised of polysilicon. Further, the layer of polysilicon forming the gate electrode layer 136 may also be used for a drain-tied field plate in some examples. Skilled artisans will recognize upon reference hereto to the formation of a drain-tied field plate is optional and therefore not necessary for purposes of some examples of the present disclosure.

Where a drain-tied field plate is optionally provided, it may be fabricated as set forth in the following sections in an example implementation. Referring to FIG. 1G, after the gate dielectric layer 134 and gate electrode layer 136 of FIG. 1F are deposited, a photomask 144 is deposited and patterned. A plasma etch process 138 may be used to define a gate electrode 140 and a drain-tied field plate 142, both formed from the gate electrode layer 136. After the plasma etch process is complete, the patterned photomask 144 is removed and a wet or dry process may be used to clean the surface of the semiconductor process wafer containing the device 100. In some arrangements, a space between the gate electrode 140 and drain-tied field plate 142 of between 200 nm and 600 nm may be provided to preclude merging of sidewall spacers during later processing. Further, a polysilicon critical dimension of between 100 nm and 300 nm may be provided for the field plate 142 to allow formation of a low sheet resistance silicide in some examples.

In some arrangements, the formation of a gate dielectric layer portion from the gate dielectric layer 134 is effectuated such that it extends over a channel region of the LDMOS transistor 101, wherein the channel region extends partway over the NDRIFT drift region 120 (e.g., channel portion 135A) and partway over the EPI layer 104 (e.g., channel portion 135B). Further, the field plate 142 may extend over a tapered end (i.e., a bird's beak) 115 of the field relief dielectric layer 114 towards a drain region whose formation will be set forth further below.

Referring to FIG. 1H, after the process wafer is cleaned, an implant mask 147 may be formed over the semiconductor device 100 to expose an area overlying the SPWELL 130 for facilitating an optional DWELL implant process in an example. In one implementation, a DWELL implant process 145 is operable to implant P-type dopants into a portion of the EPI layer 104, wherein the implant process 145 may include at least a first well ion implant process comprising a P-type dopant to form a P-type DWELL region 146. In one implementation, the P-type dopants implanted by the DWELL implant process 145 may include boron. Additionally and/or alternatively, the P-type dopants the DWELL implant process can also include larger atoms having lower diffusion coefficients than boron, such as, e.g. indium (In). In a further optional variation, an N-type dopant such as arsenic or antimony can also be added to a source side of the LDMOS transistor 101 to form an N-type DWELL region 148. Where boron is used in an example DWELL implant process, the dopant species may be implanted in multiple stages, e.g., in a lower energy process (e.g., around 30 keV, resulting in a shallow well) as well as in a higher energy process (e.g., around 800 keV, resulting in a deeper well, such that the DWELL region 146 is formed roughly laterally adjacent to the NDRIFT region 120. Whereas a high energy deep boron implant process is beneficial in distributing the dopant species to a depth sufficient to suppress parasitic body NPN effects during the operation of an LDMOS transistor, a thicker resist is generally required (typically around 4 μm to 5 μm one example implementation), thereby necessitating a larger pitch in the design layout of the LDMOS transistor. As will be seen further below, some implementations of trench contact processing in an example LDMOS flow of the present disclosure may allow P-type dopants to be distributed to a suitable depth without using a high energy implant, thus obviating the need for a thick resist. Accordingly, it should be appreciated that even where a DWELL implant process is used, a thinner photoresist may be used (e.g., <4 μm), thereby facilitating a reduction in the pitch of an LDMOS transistor in an example implementation of the present disclosure.

After the DWELL implant process 145, an example implementation may involve a polysilicon oxidation step to minimize gate-to-drain capacitance ($C_{GD}$) and gate-to-source capacitance ($C_{GS}$). After the polysilicon oxidation, lightly doped drain (LDD) implants may be patterned and implanted (not specifically shown), which may be followed by activation of the dopants by a rapid thermal process (RTP), in some examples.

Figures 1I, 1J:
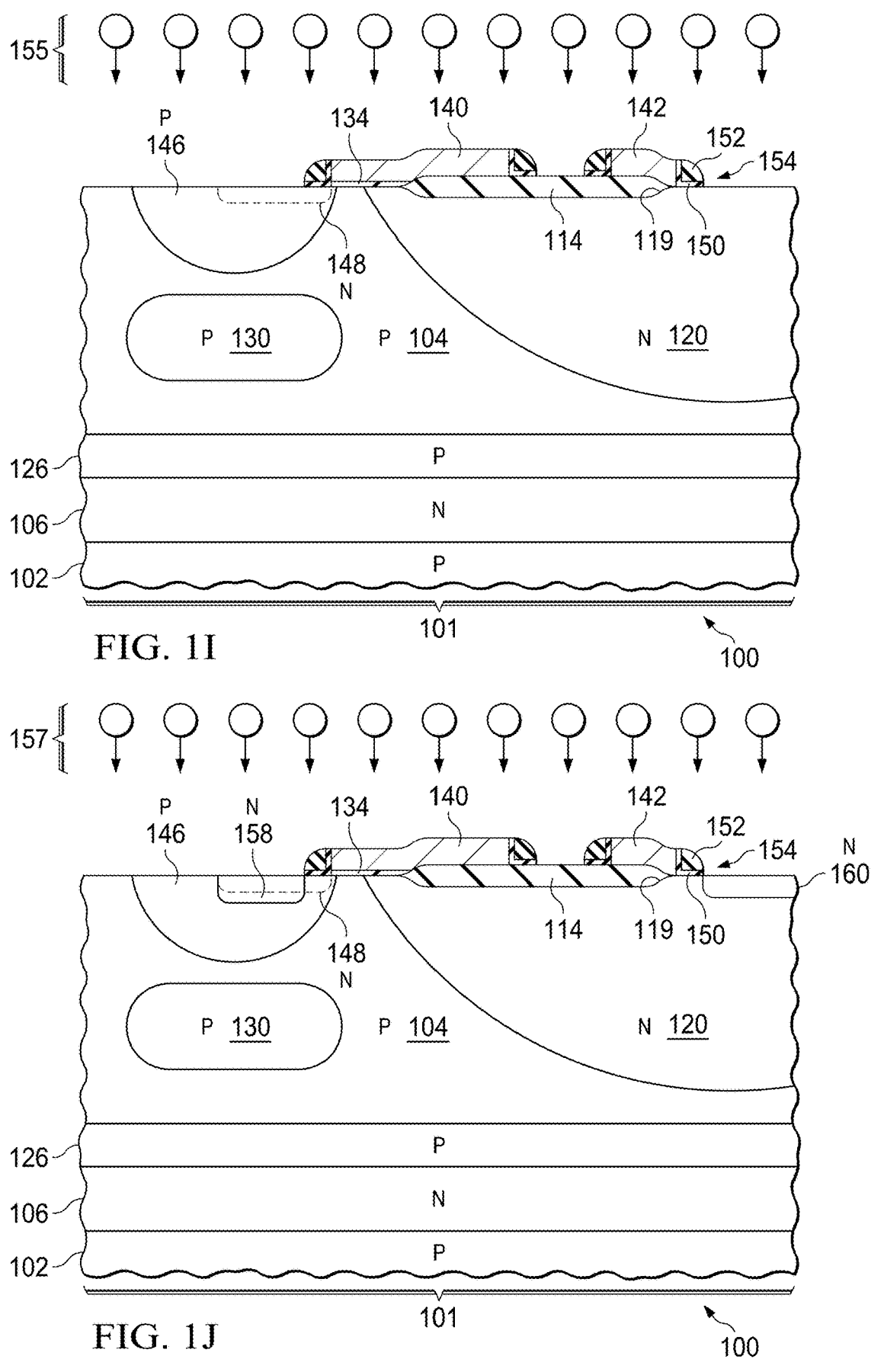

Referring to FIG. 1I, one or more dielectric layers may be deposited over the process wafer for facilitating the formation of sidewalls and/or spacer structures relative to the gate electrode 140 and the drain-tied field plate 142 (if provided). The deposited dielectric layers (not specifically shown) may be selectively removed using a blanket anisotropic plasma etch process 155 is used to remove portions of the oxide layer and portions of the nitride layer to form a sidewall spacer 154 of dielectric material that comprises a nitride layer 152 over an oxide layer 150 on vertical sidewalls of the gate electrode 140 and the drain-tied field plate 142. In one arrangement, a sidewall spacer 154 associated with the drain-tied field plate 142 may overlap an edge of the field relief dielectric layer 114 adjacent to a drain region. In a further example variation, the nitride layer 152 may be deposited across the surface of the wafer and etched to form a nitride-only sidewall spacer 154.

Referring to FIG. 1J, a patterning step (not specifically shown) and an ion implantation step 157 are used to implant a source region 158 (in the P-type DWELL region 146 where provided) and a drain region 160 in the NDRIFT drain drift region 120. The ion implantation step 157 may use an edge of the sidewall spacer 154 to self-align the drain region 160 to the drain-tied field plate 142 in an example. In one arrangement, the drain region 160 may contain an average N-type dopant density at least twice that of the NDRIFT drain drift region 120. In one arrangement, the drain-tied field plate 142, if provided, may extend between the drain region 160 and the gate electrode 140 over a distance that is greater than twice the thickness of the field relief dielectric layer 114. Also, in the illustrated example the drain-tied field plate 142 overlaps the bird's beak 115 of the drain-side of the field relief dielectric layer 114, and is spaced apart from the drain region 160 by the sidewall spacer 154.

Figure 2A:
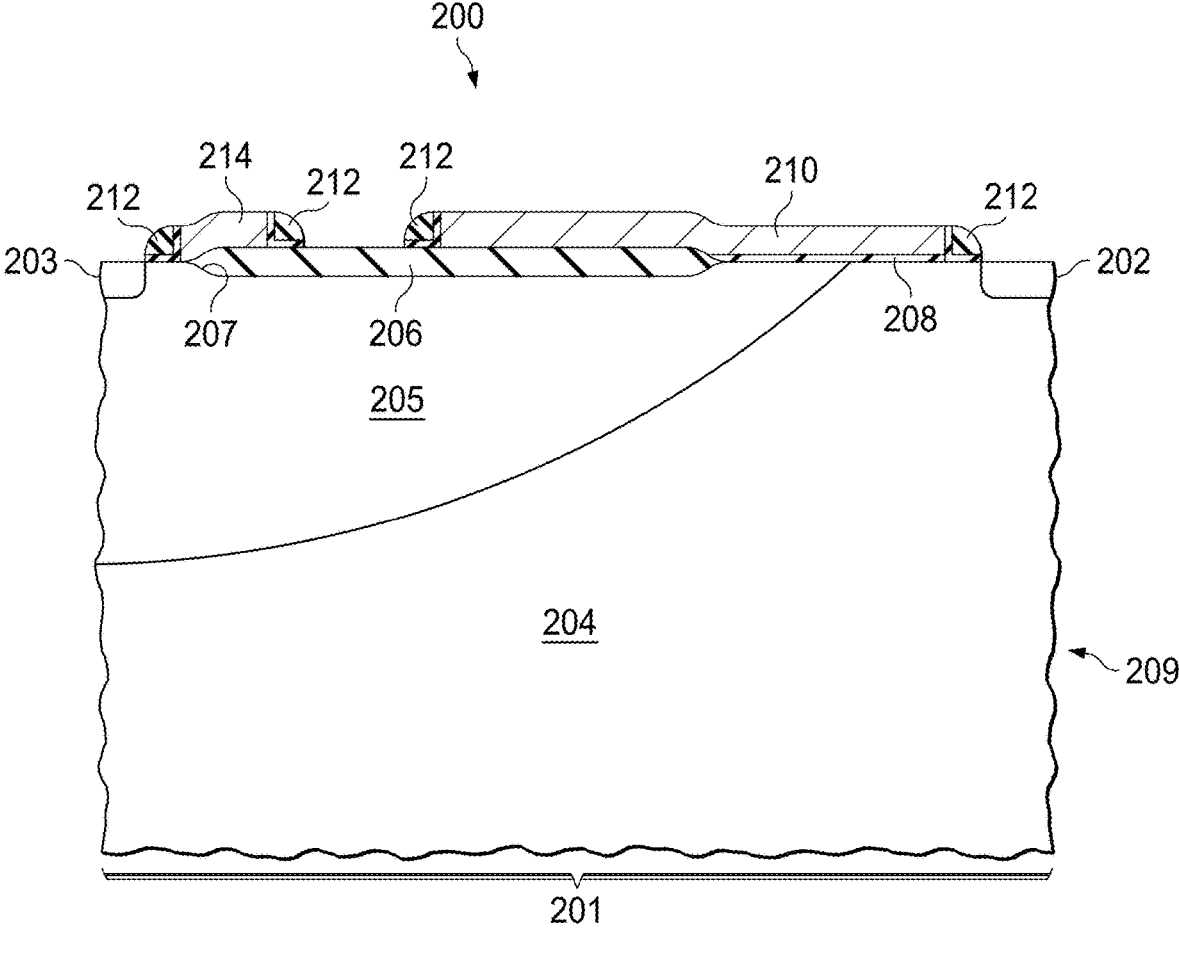
FIGS. 2A-2K depict further fabrication stages of the partially formed semiconductor device of FIG. 1J, the fabrication stages illustrating cross-sectional views of the semiconductor device having a deep trench contact and associated source-coupled gate shield according to some examples of the present disclosure.

FIGS. 2A-2K depict further fabrication stages of a partially formed semiconductor device such as the foregoing device 100 exemplified in FIG. 1J, wherein the fabrication stages are illustrative of cross-sectional views of the semiconductor device including an LDMOS transistor with a deep trench contact and associated source-coupled gate shield formed according to some examples of the present disclosure. Skilled artisans will recognize upon reference hereto that the cross-sectional view of an example device 200 including the partially-formed LCMOS transistor 201 shown in FIG. 2A is roughly analogous to the cross-sectional view of the example arrangement shown in FIG. 1J, wherein an epitaxial layer 209 formed over or in a semiconductor substrate includes a body region 204 and a drain drift region 205, the body region 204 including a source region 202 and the drain drift region 205 including a drain region 203. As before, the epitaxial layer 209 including the body region 204 is doped with a dopant species having a first conductivity type (e.g., P-type) and the drain drift region 205 of the epitaxial layer 201 is doped with a dopant species having a second conductivity type (e.g., N-type) that is opposite to the first conductivity type. The source and drain regions 202, 203, shown in FIG. 2A, correspond to the source and drain regions 158, 160 shown in FIG. 1J, respectively, having suitable dopants of the second conductivity type. In similar fashion, a field relief dielectric layer 206 having a bird's beak 207 and formed over the drain drift region 205, a gate electrode 210, a gate oxide 208, a drain field plate 214 and spacers 212 shown in FIG. 2A correspond to the field relief dielectric layer 114 having the bird's beak 115 and formed over the drain drift region 120, the gate electrode 140, the gate oxide 134, the drain field plate 142 and spacers 154 shown in FIG. 1J in accordance with an example implementation. Other structures shown in FIG. 1J are not particularly exemplified in the cross-sectional view of FIG. 2A for the sake of clarity and/or due to their optional nature in some implementations.

Figure 2B:
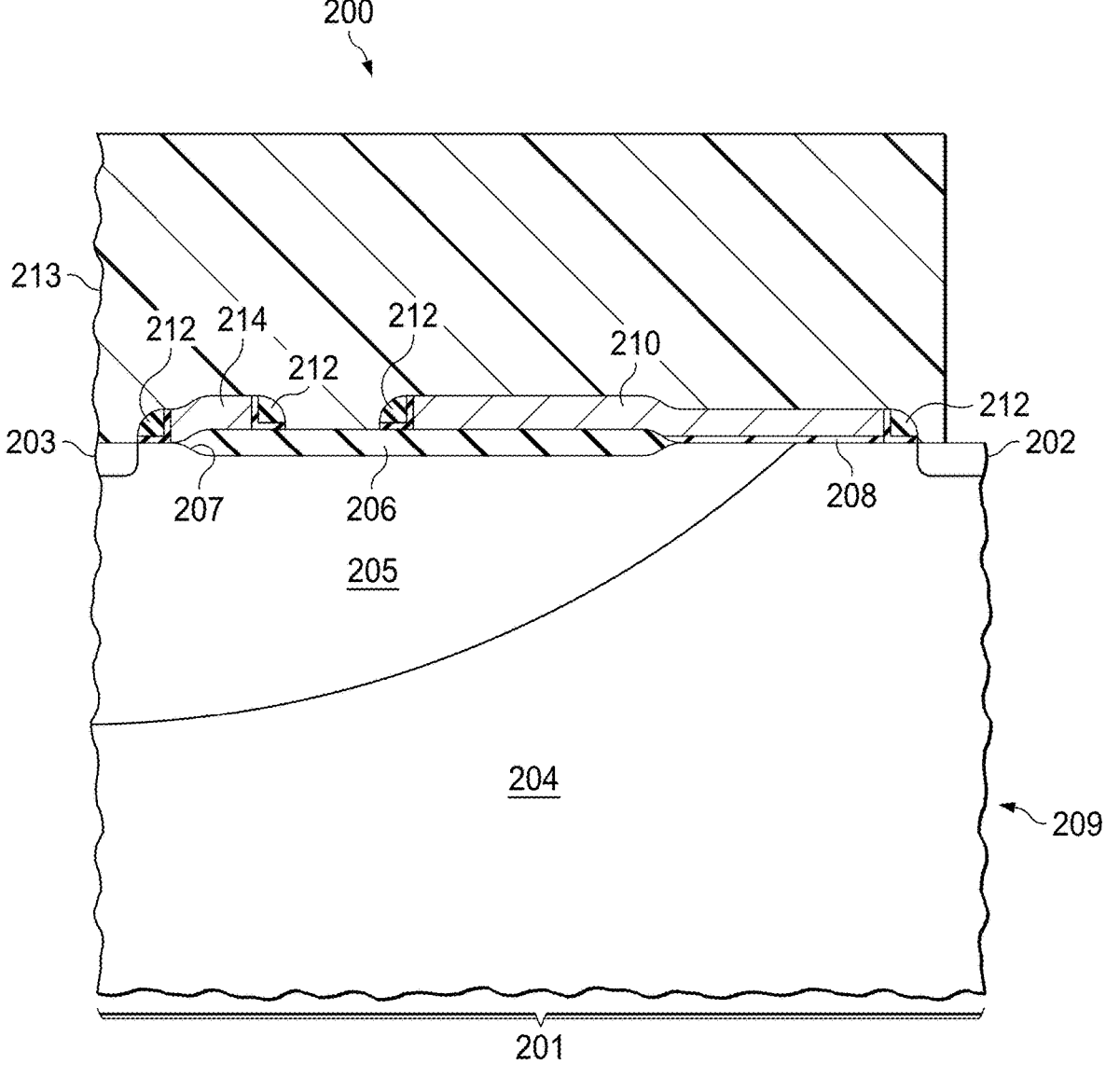
Figure 2C:
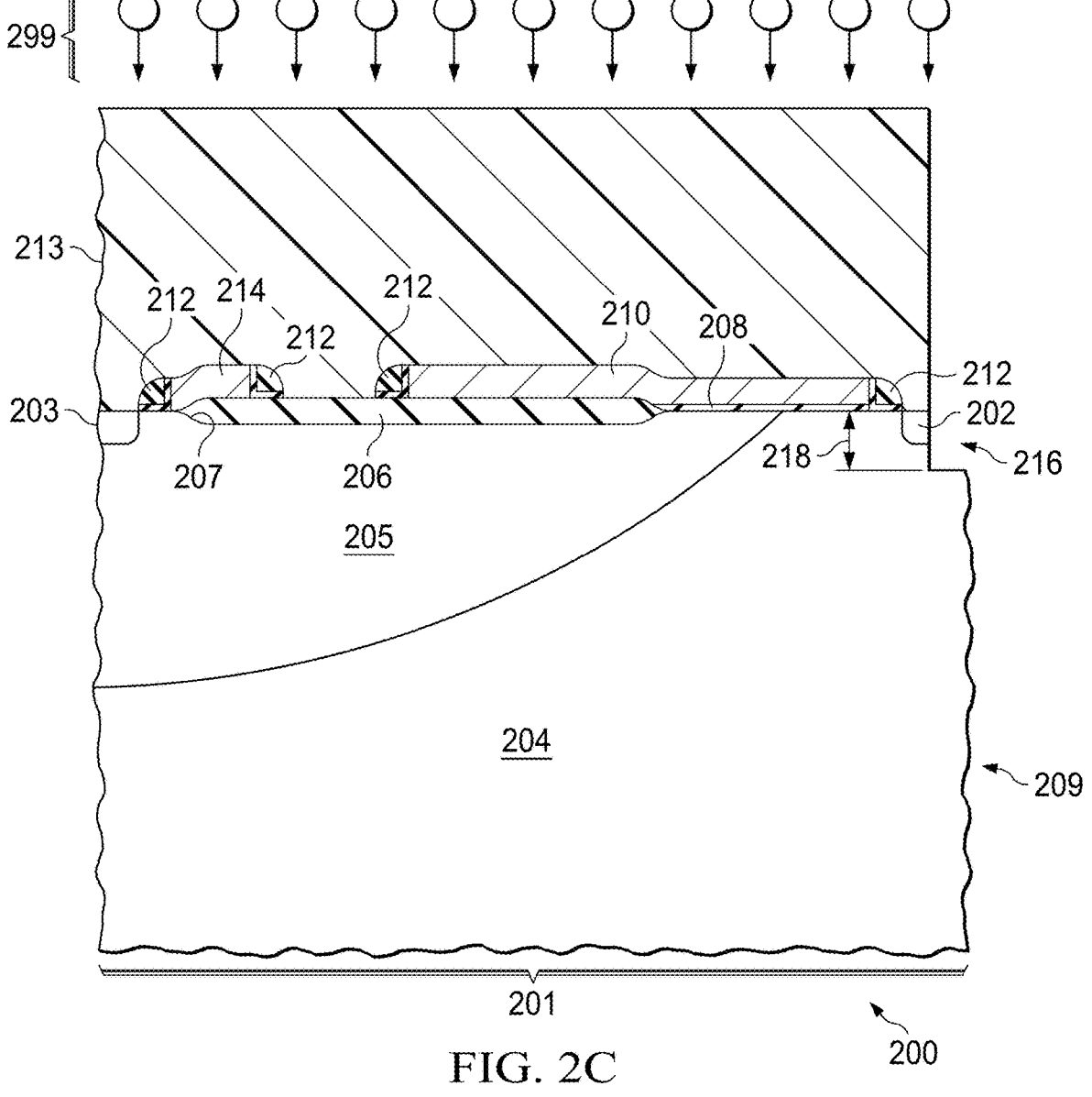

FIG. 2B is illustrative of forming a contact trench mask 213 over the process wafer, wherein the contact trench mask 213 may comprise a photoresist layer having a thickness of about 1.0 μm and patterned to mask spacers 212 associated with the source and drain regions 202, 203 but expose at least a portion of the source region 202 for defining a contact trench in subsequent processing. Depending on implementation, a P-type source-drain (PSD) implant mask used in forming a backgate/body contact region in the CMOS section of the process flow may also be used as the contact trench mask in an example arrangement. FIG. 2C is illustrative of a contact trench etch process 299 that may involve plasma dry etching in an example implementation for forming a deep contact trench 216 (or, "trench" for short) that may have a depth 218 of around 0.25 μm in an example. Depending on implementation, the trench depth 218 can be in the range of about 0.15 μm to 0.5 μm. In general, the trench depth 218 can be significantly greater than 10 nm to 20 nm, typical contact depths formed in a baseline contact etch process. In one example, the depth 218 can be greater than 0.25 μm depending on the operating voltages and process technologies, and may even reach or terminate within an SPWELL region in some arrangements (e.g., SPWELL 130 shown in FIG. 1J). In general, the depth 218 of trench 216 may be variable based on the SPWELL implant conditions, operating voltage ranges of the device, as well as the conditions of a trench implant process for forming a trench contact in subsequent processing. These parameters may be modulated in various permutations and combinations in order to achieve a particular set of conditions for implementation in an example device that may yield a trench depth that is beneficial in helping suppress the parasitic bipolar effects and improve the safe operating area of the device while maintaining requisite breakdown voltage (BV) performance without the on-resistance (RDSON) trade-off. As skilled artisans recognize, whereas having a higher BV is desirable in power applications, having a low on-resistance is also important for the performance of an LDMOS device. In general, a process designed to optimize the BV performance in an LDMOS also increases the on-resistance, thereby necessitating a design trade-off, which is advantageously avoided in the examples disclosed herein. Moreover, a source-tied gate shield may be formed in the same metal process for forming the trench contact according to an example of the present disclosure, which may be operable to reduce electromagnetic field (EMF) coupling effects within the device (e.g., due to the Faraday shielding, thereby reducing signal distortion). Accordingly, some examples of the present disclosure may be configured with a suitable gate shield structure for advantageously improving the switching performance of the device at high frequencies including e.g., radio frequencies (RF), as will be seen further below.

Whereas the depth of a contact trench may be varied to achieve certain design objectives, it should be appreciated that as the depth varies, the width of a trench may also vary. In general, deeper trenches may require wider openings, which may increase the device pitch. Accordingly, appropriate design rule checks (DRCs) may also control a particular contact trench formation process in an example implementation. By way of illustration, a contact trench having a depth of 0.25 μm may have a width of 0.2 μm in one arrangement. In a further example, a contact trench may be formed so as to have a depth that does not extend beyond the SPWELL region.

Figure 2D:
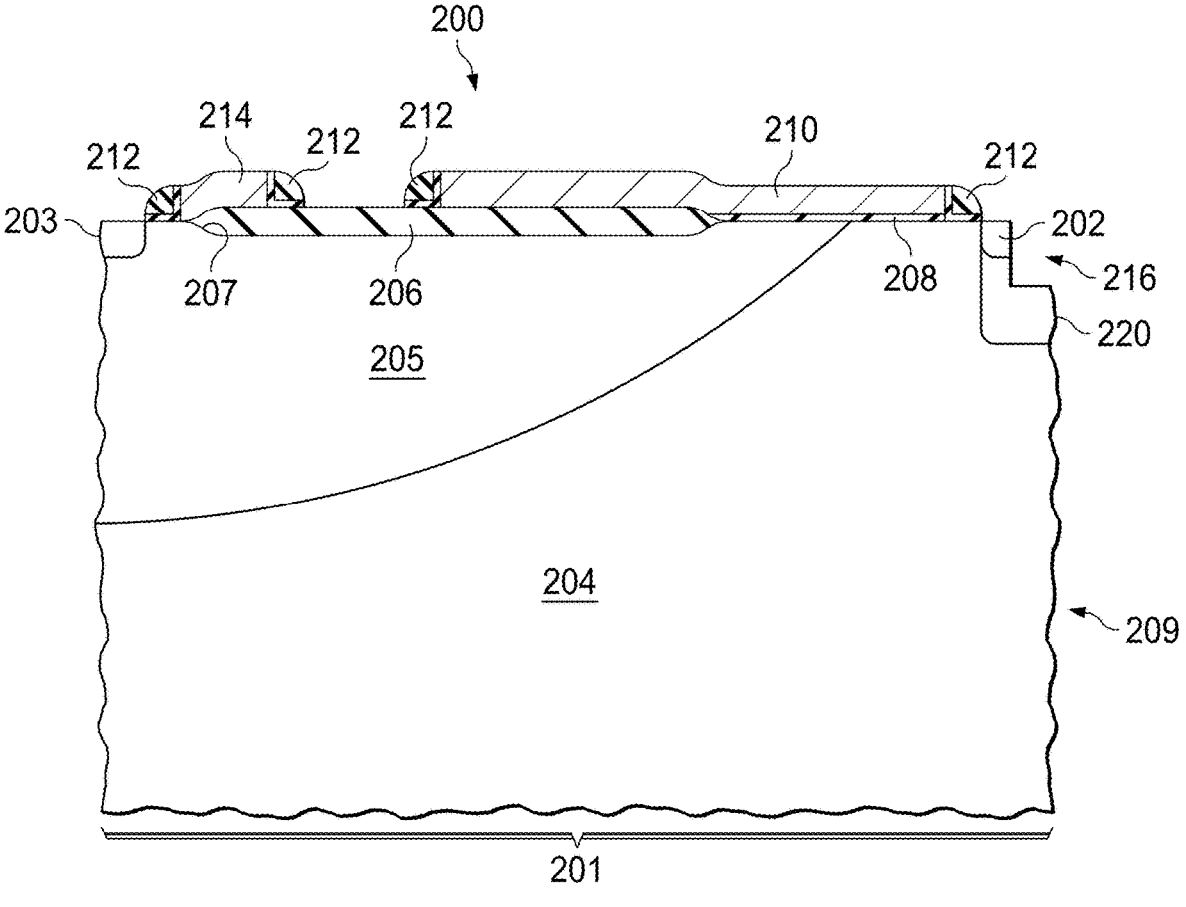

After forming the contact trench 216, a PSD contact implant process may be performed (not specifically shown in FIG. 2C), which may involve one or more implanting steps comprising boron species having different energy levels, dosages and/or implant angles. In one example, a boron implant at around $7 \times 10^{13}$ cm$^{-2}$ with an implant energy level of around 10 keV and a 20° tilt may be followed by another boron implant at around $3.66 \times 10^{15}$ cm$^{-2}$ with an implant energy level of around 4 keV and a 0.1° tilt, which in turn may be followed by a fluorine implant at around $1.0 \times 10^{15}$ cm$^{-2}$ with an implant energy level of around 10 keV and a 0.10° tilt. As a result of the foregoing, a backgate or body contact region 220 may be formed surrounding and/or adjacent to the bottom of the contact trench 216 formed in the source region 202. A resist strip operation may be performed subsequently to remove the mask 213, as shown in FIG. 2D.

Figure 2E:
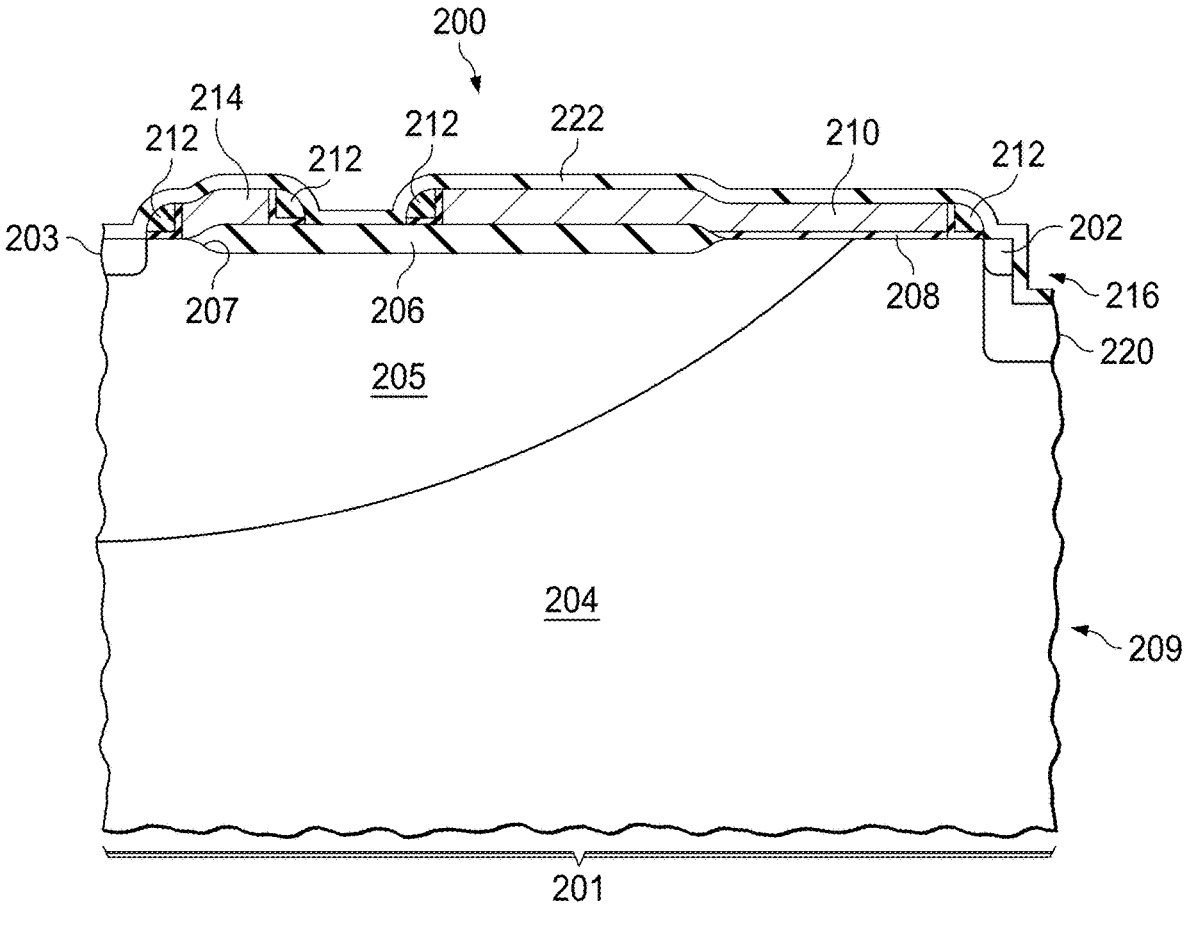
Figure 2F:
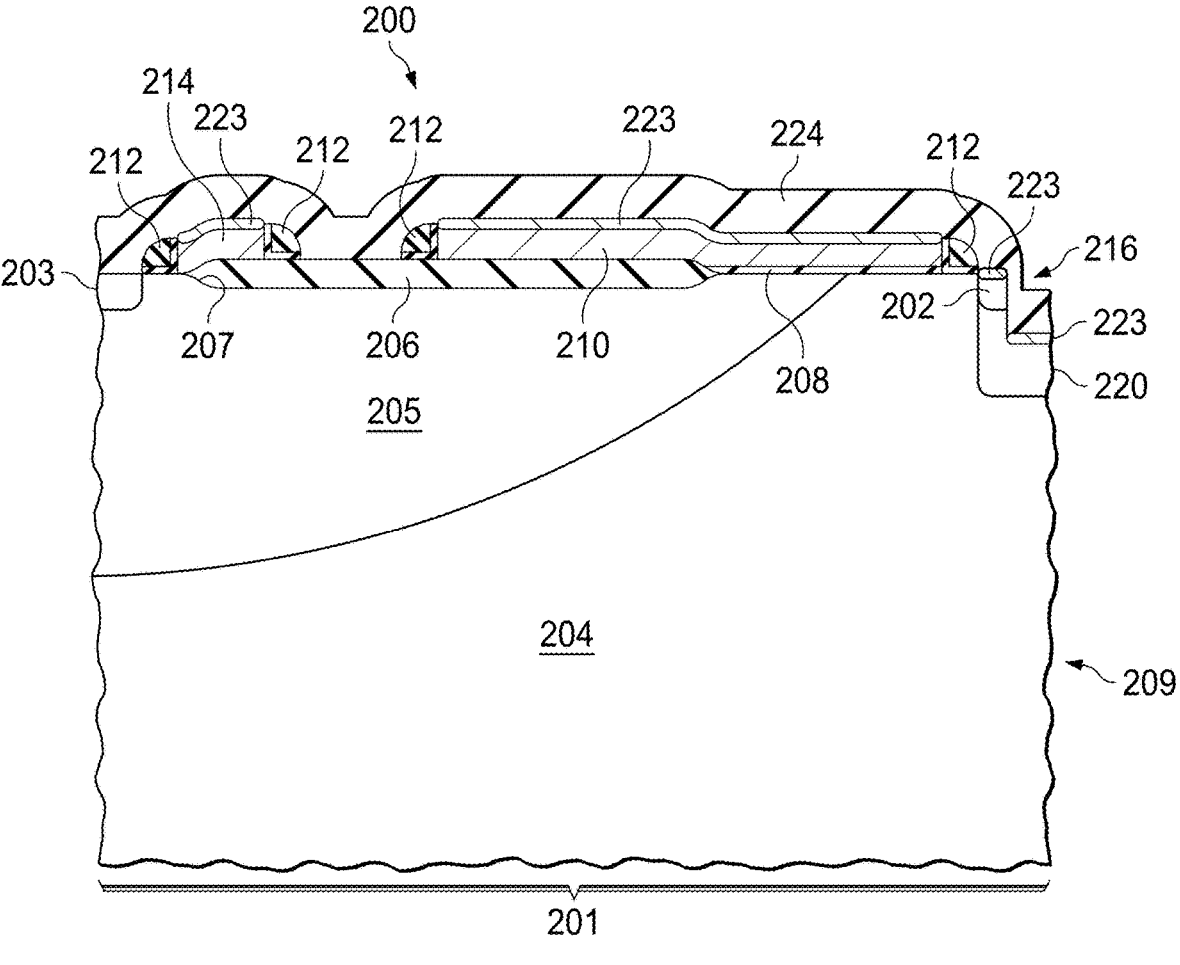

In some arrangements, a silicide blocking layer 222 may be formed by depositing one or more sublayers of an oxide, a nitride, an oxynitride, or any combination thereof over the process wafer, as exemplified in FIG. 2E. The silicide blocking layer 222 may be patterned (not specifically shown) and one or more sublayers may be etched away in regions where a metal silicide layer is to be formed, e.g., including the contact trench 216. The silicide blocking layer 222 may be allowed to remain in areas at the wafer surface where silicide is not intended to be formed. In at least one implementation, the silicide blocking layer is not required for LDMOS formation, and may be omitted. After the silicide blocking layer 222 has been formed and patterned, a metal layer (e.g., comprising titanium, tungsten, etc., not specifically shown), which forms a metal silicide at temperatures consistent with silicon processing conditions (e.g., annealing via rapid thermal processing) may be deposited on the wafer surface. In one arrangement, the semiconductor device 200 may be heated to form the metal silicide layer 223 in exposed regions, e.g., the gate electrode 210, the bottom of the trench 216, the source region 202, and the drain-tied field plate 212, as exemplified in FIG. 2F. Unreacted metal may be subsequently removed in a wet stripping process (not specifically shown). Further, a tetraethyl orthosilicate (TEOS) layer 224 may be deposited in an example implementation as illustrated in FIG. 2F, which is operable as a precursor to forming a gate shield oxide in subsequent process. In one example, the TEOS layer 224 may have a thickness of about 0.1 μm to 0.2 μm depending on implementation.

Figure 2G:
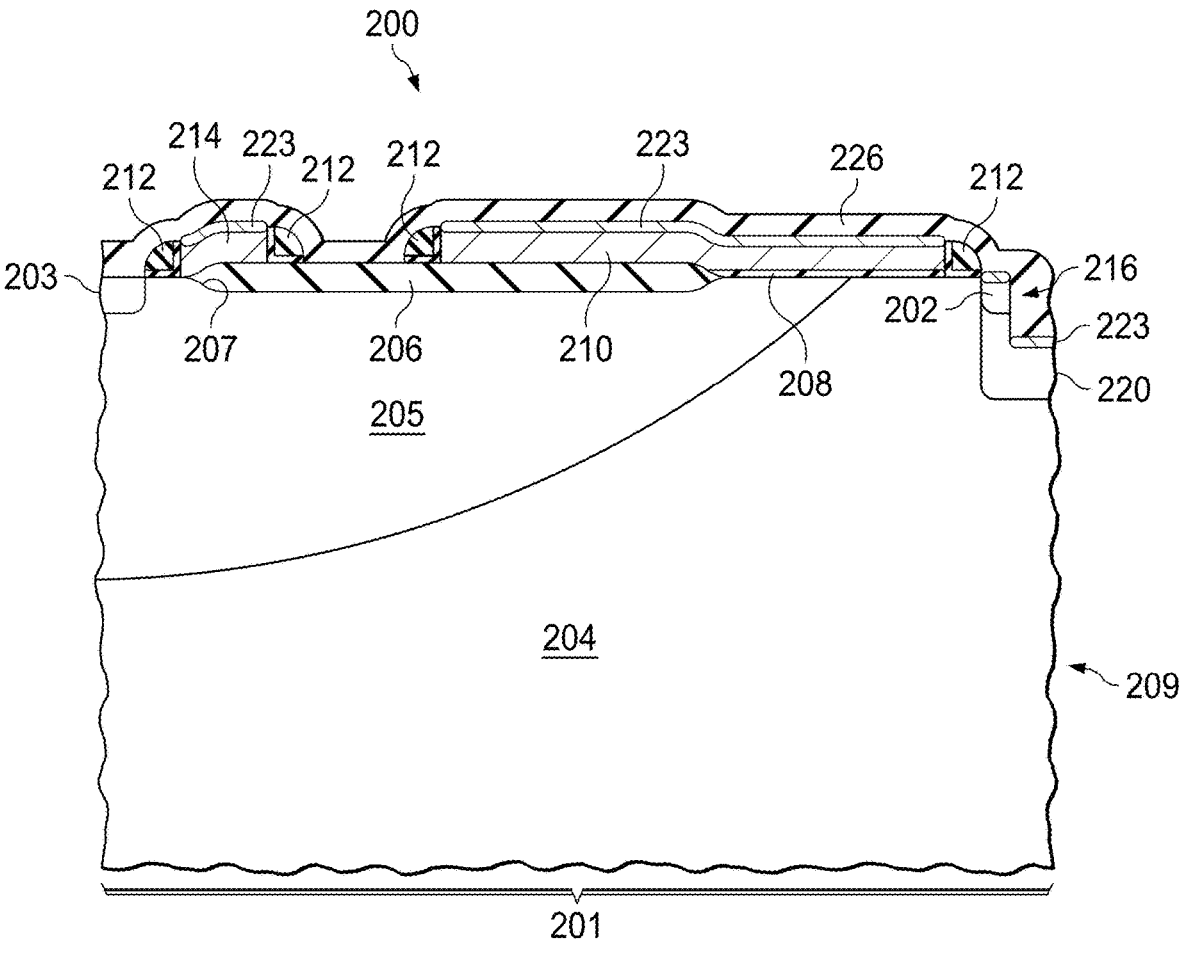
Figure 2H:
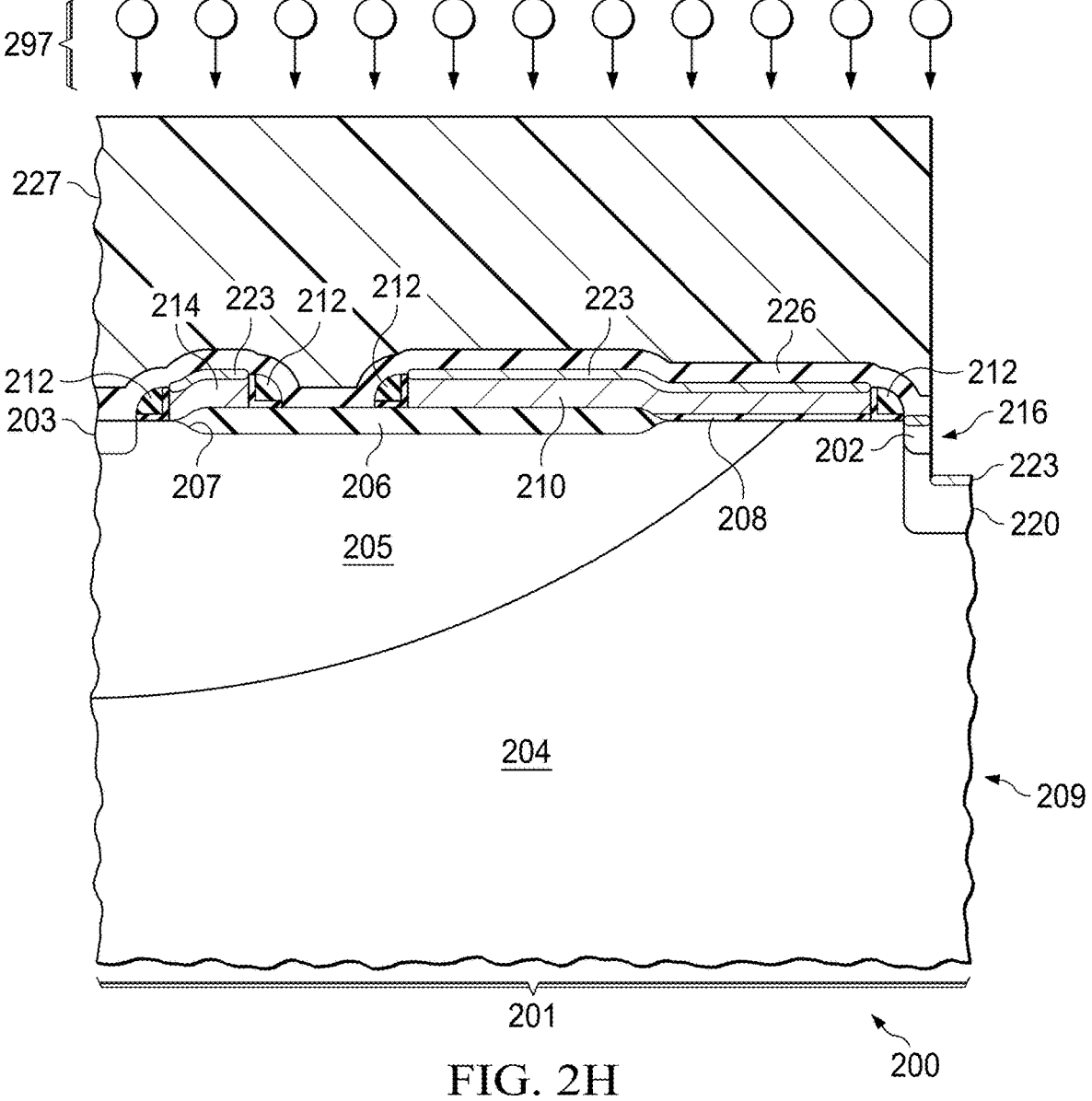
Figure 2I:
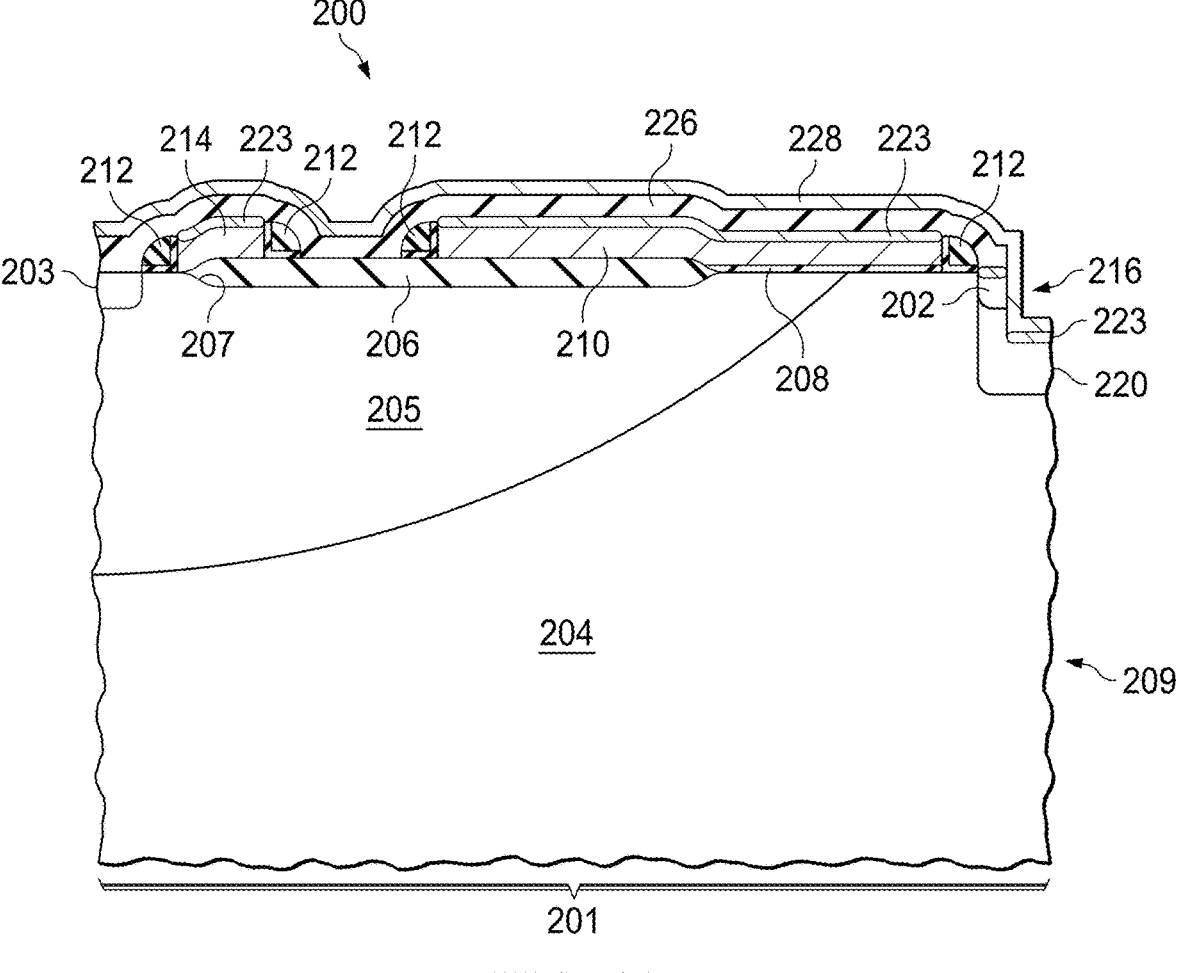

In one example, a surface clean process (e.g., a chemical mechanical polishing (CMP) operation, not specifically shown) may be implemented prior to depositing a dielectric layer 226 (e.g., an oxide) as exemplified in FIG. 2G, which may be operable as a gate shield dielectric layer where a gate shield is formed thereover. Depending on implementation, the dielectric layer 226 may have a thickness of about 0.1 μm to 0.5 μm. Referring to FIG. 2H, a photomask 227 having a thickness of about 0.1 μm may be deposited for facilitating removal of the dielectric layer material from contact trench 216, e.g., by a suitable etching operation 297. Subsequently, a gate shield metal layer 228 may be deposited over the process wafer using any type of metal in a suitable deposition operation, wherein the contact trench 216 is filled with the metal for making electrical contact (e.g., ohmic contact) with the backgate/body contact region 220 as illustrated in FIG. 2I. Where there is no gate shield, the metal deposition process effectively becomes similar to a contact metallization process used for forming a deep trench contact for the source and the body of the LDMOS device as will be set forth below. In one example, aluminum may be used for depositing the gate shield metal layer 228, which may have a thickness of about 20 nm to 80 nm depending on implementation. In some arrangements, the thickness gate shield metal layer 228 may be optimized for a particular process technology and/or the intended operational voltages of the device 200, which may vary considerably, e.g., 20 V to 60 V, depending on the application.

Figure 2J:
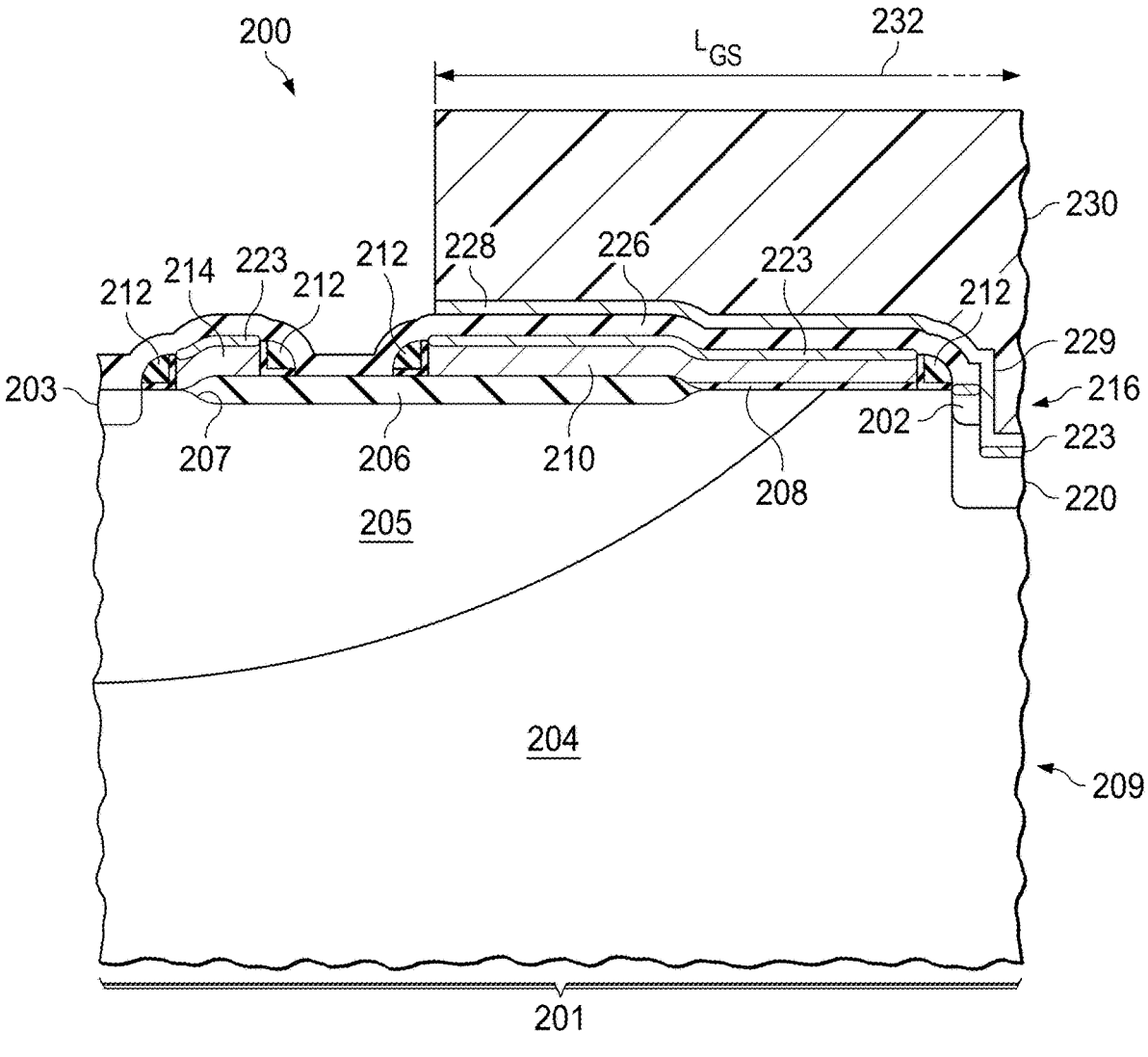

Referring to FIG. 2J, a photomask 230 having a thickness of about 0.1 μm may be deposited for forming a gate shield having a length 232, wherein the metal of the gate shield metal layer 228 is removed (e.g., via a suitable metal etch) from the regions not covered by the patterned photomask 230. In one example where a gate shield is not provided, the photomask 230 may be patterned so as to define only the trench contact layout for forming a deep trench contact in the source region 202. As illustrated, the implementation shown in FIG. 2J exemplifies the gate shield formation, wherein the patterned gate shield 228 may be formed so as to comprise a continuous metal structure from the contact trench 216 and extending over at least a portion of the gate electrode 210 underlying the gate shield dielectric layer 226. As with the thickness of the gate shield 228, the length 232 of the gate shield 228 may be variable depending on implementation and may be optimized for obtaining a suitable/acceptable SOA based on the process technology and operational voltages of the device 200. Further, the length 232 of the gate shield 228 may be determined in reference to a length of the underlying gate electrode 210 in some examples. By way of illustration, the gate shield 228 may have a length 232 that is equal to the length of the gate electrode 210 plus or minus a predetermined amount, e.g., about 0.1 μm to 0.2

μm. In some arrangements, the gate shield 228 may not extend over the drain region 203 and/or over the drain-tied field plate 212 (where provided).

Because the gate shield 228, where provided, includes or forms a continuous metal structure with a metal portion 229 filling the contact trench 216, yet another measurement of a length may involve determining a "total length" that is a sum of the length of the substantially horizontal portion of the continuous metal structure overlying the gate electrode 210 and the length of the substantially vertical metal portion 229 in the contact trench 216 (which in turn is defined by the depth of the contact trench 216). Regardless of how the length of a continuous gate shield metal structure is defined, it should be appreciated that the dimensions of the substantially horizontal portion and the substantially vertical portion of the continuous gate shield metal structure may be modulated in an example LDMOS device to achieve parasitic bipolar suppression as well as a reduction in the EMF coupling without compromising the breakdown voltage performance of the LDMOS device.

Figure 2K:
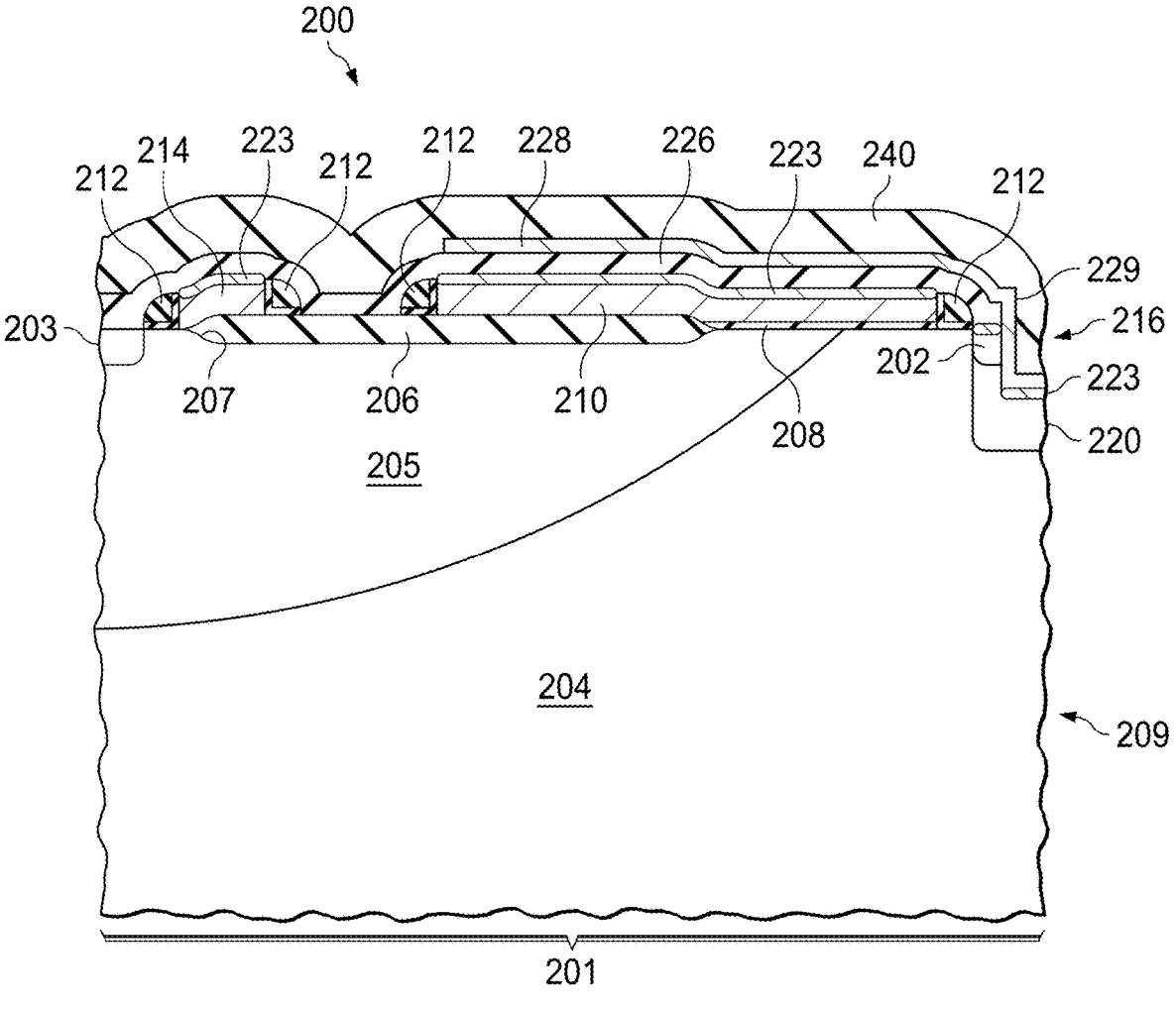

After forming the gate shield structure 228, the photomask 230 may be removed, e.g., using a suitable resist strip operation, followed by a dielectric layer deposition for forming a dielectric layer 240 over the device 200 as illustrated in FIG. 2K. Depending on implementation, the dielectric layer 240 may have a suitable thickness and composition, which may form a pre-metal dielectric (PMD) layer or an interlayer dielectric (ILD) layer through which suitable contacts may be formed (not specifically shown) for facilitating subsequent metallization and interconnectivity of the device 200. For example, a source/trench contact, a drain contact, a gate electrode contact, and a field plate contact (where a drain-tied field plate is provided) may be patterned, etched, and filled with a suitable metal such as tungsten using appropriate processing steps known in the art.

Figure 3:
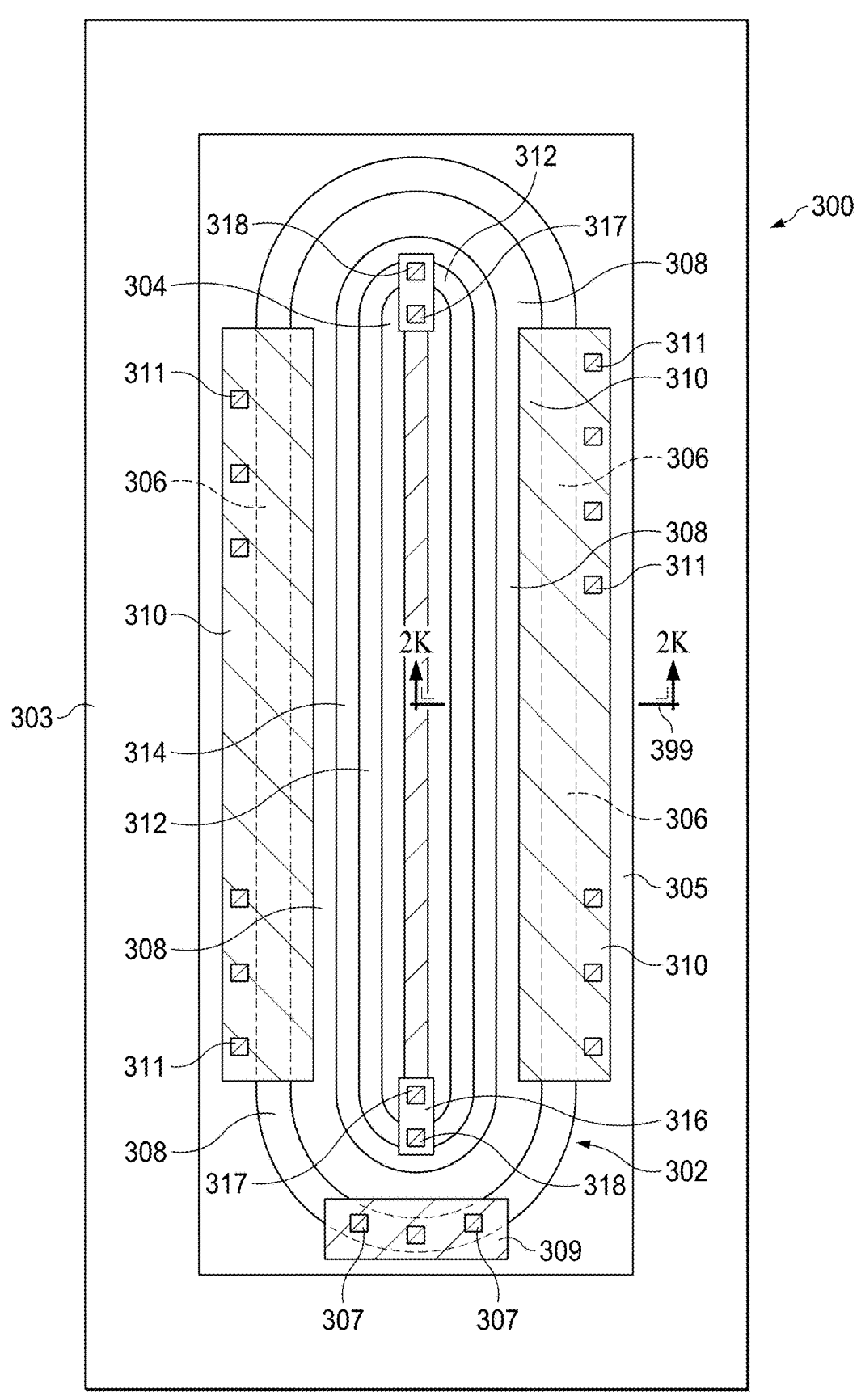
FIG. 3 depicts a top down view of a semiconductor device in a "racetrack" or closed-loop configuration having a source-coupled gate shield according to some examples of the present disclosure.

FIG. 3 is a top view of an example semiconductor device 300 that includes an LDMOS transistor 302 with a source-tied gate shield 310, where a source 306, gate electrode 308 and a drain-tied field plate 312 are disposed in a "racetrack" or closed-loop configuration according to an example implementation. The drain-tied field plate 312, if and where provided, may be formed with rounded corners to reduce electric fields. Likewise, although the source-tied gate shield 310 is exemplified as two rectangular strips having corners, the source-tied gate shield 310 may also be formed in a closed-loop configuration having rounded corners. In this context, the term "corner" refers to the transition of the direction of a structure from one direction to another direction, e.g., a transition from a first direction to an orthogonal second direction. A silicide blocking layer 314 may be disposed between the gate electrode 308 and the source-tied gate shield 310 as well as the drain-tied field plate 312 (if provided). A plurality of contacts 307 may be provided for connecting the gate 308 to a gate interconnect 309 that may be part of a metal layer. Likewise, a plurality of contacts 311 may be provided for connecting the source-tied gate shield 310 and the source 306 to a metal layer interconnect (not shown). Also, contacts 318 may be provided for connecting the drain-tied field plate 312 to drain contact(s) 317 and drain 304 through a metal layer interconnect 316 by way of example. An isolation tank 303 along with a DWELL 305 (optionally provided) is shown framing the LDMOS transistor 302. Skilled artisans will recognize upon reference hereto that a cross-section of device 300 along a sectional line 399 is operable to yield a view substantially identical to the cross-sectional view shown in FIG. 2K by way of illustration.

FIG. 4 is a flow chart of a method of fabricating a semiconductor device including an LDMOS transistor according to some examples of the present disclosure. Example method 400 may include forming a body region and a drain drift region in an epitaxial layer over or of a semiconductor substrate, wherein the body region has dopants of a first conductivity type, e.g., P-type and the drain drift region has dopants of a second, opposite, conductivity type, e.g., N-type (block 402). At block 404, a gate dielectric layer may be formed over the body region, the gate dielectric layer extending over a junction between the body region and the drain drift region. At block 406, a field relief dielectric layer may be formed over the drain drift region. In one arrangement, the field relief dielectric layer may be formed in a LOCOS process and may extend from the gate dielectric layer, terminating in a bird's beak. At block 408, a gate electrode may be formed over the gate dielectric layer. At block 410, source and drain regions may be formed in the epitaxial layer. The drain region may be formed proximate to the bird's beak and may include a suitable dosage of dopants of the second conductivity type in the drain drift region. The source region may be formed proximate to the gate electrode and may include a suitable dosage of dopants of the second conductivity type in the body region. At block 412, a dielectric layer may be over the gate electrode. In one example, the dielectric layer may be operable as a gate shield dielectric layer where a gate shield is provided. At block 414, a gate shield may be formed over the gate shield dielectric layer, wherein the gate shield is coupled to a trench contact formed in or otherwise electrically contacting the source region. As noted previously, the formation of a gate shield can be optional in an example implementation. In one arrangement, therefore, there may be no gate shield overlying the gate electrode. In another arrangement, the gate shield may extend over at least a portion of the gate electrode underlying the gate shield dielectric layer. At block 416, various contacts and interconnects may be formed through an ILD/PMD layer formed over the gate shield and/or trench contact for facilitating subsequent metallization operations.

Figures 5, 6:
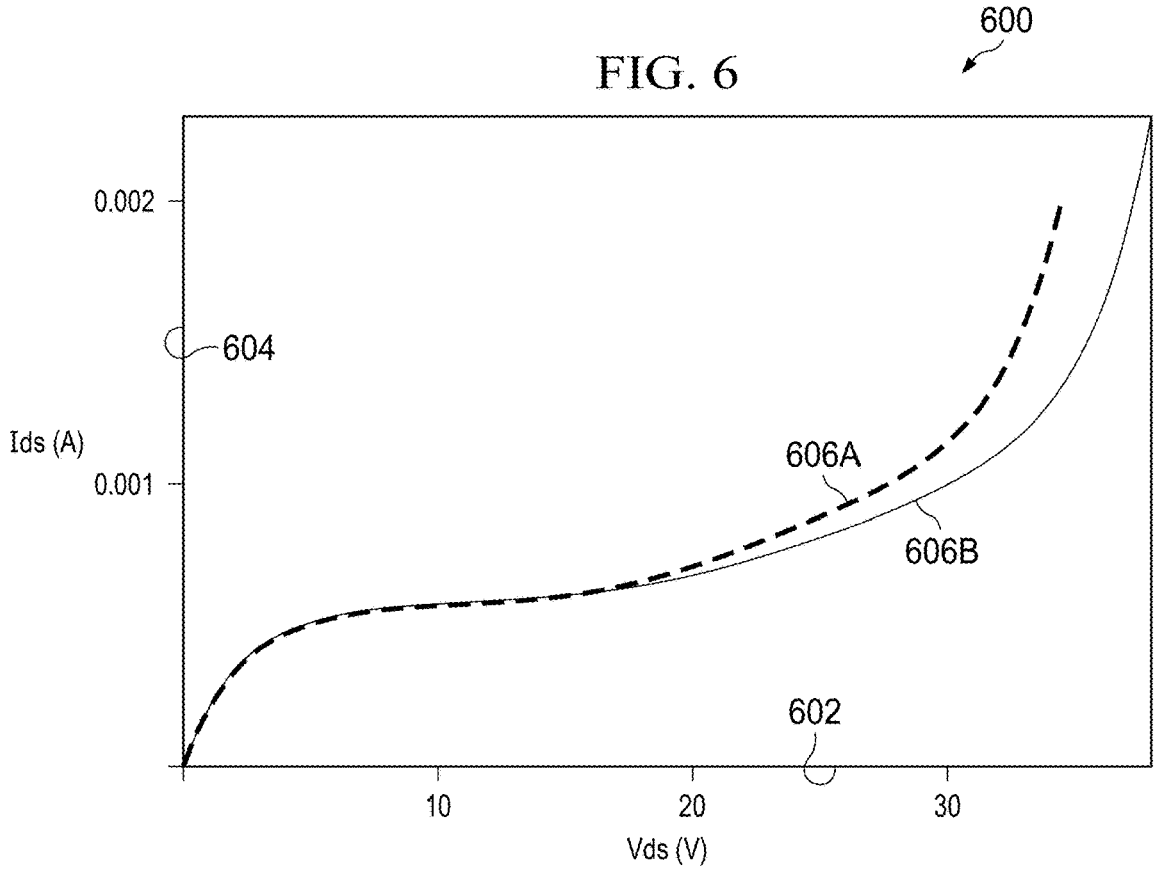
FIGS. 5 and 6 depict representative electrical performance characteristics of a semiconductor device according to some examples of the present disclosure.

FIGS. 5 and 6 depict representative electrical performance characteristics of a semiconductor device according to some examples of the present disclosure. Row 502 of table 500 shown in FIG. 5 illustrates electrical characteristics of a baseline LDMOS device in terms of breakdown voltage (BV) 506, specific on-resistance (Rsp) 508, threshold voltage (Vth) 510 and snap-back voltage (Vsnap) 512. Row 504 is illustrative of electrical characteristics of an example LDMOS obtained via simulation, wherein an improvement in the snap-back criterion 512 is exemplified (thereby resulting in a better SOA) while maintaining the other performance criteria. Snap-back performance is also graphically illustrated in a graph 600 shown in FIG. 6 wherein a drain-to-source current (Ids) 604 is plotted against a drain-to-source voltage (Vds) 602. Curves 606A and 606B correspond to a baseline device and an example device of present disclosure, respectively, obtained at a gate voltage (Vg) of 5 V, wherein curve 606B exhibits an additional margin of about 4 V to 5 V in an example implementation.

Further, the length and/or thickness of a source-tied gate shield may be modulated in an example LDMOS device to reduce EMF coupling between the input and output nodes of the example LDMOS device as noted previously. Additionally, the source-tied gate shield of an example LDMOS device may be operable to minimize gate-to-drain feedback capacitive coupling in the device (e.g., caused by the Miller effect). It should be appreciated that the reduction in EMF coupling as well as capacitive coupling effectuated by the source-tied gate shield in an example LDMOS device can be beneficial in increasing the switching frequency of the LDMOS device, thereby resulting in a higher bandwidth, which may be particularly advantageous in high frequency applications (e.g., RF applications).

Because DWELL formation may be omitted and/or performed without high energy implants in some arrangements (while still maintaining requisite suppression of the NPN parasitic effects), an example implementation can be configured with a reduced device pitch, thereby resulting in a smaller LDMOS device without compromising performance. Such pitch reductions may be advantageous in integrating an example LDMOS device of the present disclosure in hybrid or advanced process technologies including such as, e.g., linear bipolar CMOS (LBC) technology.

It will be recognized upon reference hereto that whereas a gate shield may be provided in a device intended for RF applications, where the length and thickness of the gate shield may be varied to obtain suitable switching frequency performance, the gate shield may not be needed in devices intended for power applications where the formation of a trench contact having a suitable depth is beneficial in reducing the hole current injection into the body and thereby achieve parasitic suppression. Whereas example arrangements set forth hereinabove may therefore be expected to provide a combination of various tangible improvements in the processing and/or performance of an LDMOS device depending on application, no particular result is a requirement unless explicitly recited in a particular claim.

While various examples of the present disclosure have been described above, it should be understood that they have been presented by way of example only and not limitation. Numerous changes to the disclosed examples can be made in accordance with the disclosure herein without departing from the spirit or scope of the disclosure. Thus, the breadth and scope of the present invention should not be limited by any of the above described examples. Rather, the scope of the disclosure should be defined in accordance with the claims appended hereto and their equivalents.

For example, in this disclosure and the claims that follow, unless stated otherwise and/or specified to the contrary, any one or more of the layers set forth herein can be formed in any number of suitable ways, such as with spin-on techniques, sputtering techniques (e.g., Magnetron and/or ion beam sputtering), (thermal) growth techniques or deposition techniques such as chemical vapor deposition (CVD), physical vapor deposition (PVD), PECVD, or atomic layer deposition (ALD), etc. As another example, silicon nitride may be a silicon-rich silicon nitride or an oxygen-rich silicon nitride. Silicon nitride may contain some oxygen, but not so much that the materials dielectric constant is substantially different from that of high purity silicon nitride.

Further, in at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Also, some blocks in the flowcharts may be optionally omitted. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

It should therefore be clearly understood that the order or sequence of the acts, steps, functions, components or blocks illustrated in any of the flowcharts and/or block diagrams depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present disclosure.

At least some portions of the foregoing description may include certain directional terminology, such as, e.g., "upper", "lower", "top", "bottom", "left-hand", "right-hand", "front side", "backside", "vertical", "horizontal", etc., which may be used with reference to the orientation of some of the Figures or illustrative elements thereof being described. Because components of some examples can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. Further, the features of examples described herein may be combined with each other unless specifically noted otherwise.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the claims appended below.

What is claimed is:
1. A semiconductor device, comprising:
a semiconductor substrate including an epitaxial layer, the epitaxial layer including a body region having a first conductivity type and a drain drift region having a second, opposite, conductivity type;
a gate dielectric layer over the body region and extending over a junction between the body region and the drain drift region;
a gate electrode over the gate dielectric layer;
a drain region having the second conductivity type in the drain drift region;

a field relief dielectric layer over the drain drift region, the field relief dielectric layer extending from the gate dielectric layer toward the drain region;

a source region having the second conductivity type in the body region, the source region formed proximate to the gate electrode;

a gate shield dielectric layer over the gate electrode; and a gate shield over the gate shield dielectric layer, the gate shield coupled to a trench contact electrically contacting the source region and extending over at least a portion of the gate electrode.

2. The semiconductor device as recited in claim 1, wherein the trench contact has a depth of about 0.15 µm to 0.5 µm into the body region.

3. The semiconductor device as recited in claim 1, further comprising a backgate region underlying the source region, the backgate region including a dopant species of the first conductivity type, the trench contact extending into the backgate region.

4. The semiconductor device as recited in claim 1, wherein the gate shield dielectric layer has a thickness of about 0.1 µm to 0.5 µm.

5. The semiconductor device as recited in claim 1, wherein the gate shield comprises a metal layer having a thickness of about 20 nm to 80 nm.

6. The semiconductor device as recited in claim 1, further comprising a metal silicide layer over the trench contact, wherein the gate shield touches the metal silicide layer.

7. The semiconductor device as recited in claim 6, wherein the silicide layer comprises titanium and the gate shield comprises aluminum.

8. The semiconductor device as recited in claim 5, wherein the gate shield has a length equal to a length of the gate electrode plus or minus of about 0.1 µm to 0.2 µm.

9. The semiconductor device as recited in claim 1, wherein the field relief dielectric layer comprises a local oxidation of silicon (LOCOS) structure having a bird's beak terminating adjacent to the drain region.

10. The semiconductor device as recited in claim 1, further comprising a sidewall spacer disposed on a sidewall of the gate electrode proximate to the source region.

11. A method of fabricating a semiconductor device, comprising:

forming a body region and a drain drift region in an epitaxial layer of a semiconductor substrate, the body region having a first conductivity type and the drain drift region having a second, opposite, conductivity type;

forming a gate dielectric layer over the body region, the gate dielectric layer extending over a junction between the body region and the drain drift region;

forming a field relief dielectric layer over the drain drift region, the field relief dielectric layer extending from the gate dielectric layer and terminating in a bird's beak;

forming a gate electrode over the gate dielectric layer;

forming a drain region having the second conductivity type in the drain drift region, the drain region formed proximate to the bird's beak;

forming a source region having the second conductivity type in the body region, the source region formed proximate to the gate electrode;

forming a gate shield dielectric layer over the gate electrode; and forming a gate shield over the gate shield dielectric layer, the gate shield coupled to a trench contact electrically contacting the source region and extending over at least a portion of the gate electrode.

12. The method as recited in claim 11, wherein the trench contact is formed to have a depth of about 0.15 µm to 0.5 µm into the body region.

13. The method as recited in claim 11, further comprising:

forming a backgate region underlying the source region, the backgate region including with a dopant species of the first conductivity type; and forming the trench contact extending into the backgate region.

14. The method as recited in claim 13, further comprising forming a DWELL region in the body region, the DWELL region surrounding the source region.

15. The method as recited in claim 11, wherein the gate shield dielectric layer is formed to have a thickness of about 0.2 µm to 0.5 µm.

16. The method as recited in claim 11, wherein the gate shield is formed of a metal layer having a thickness of about 20 nm to 80 nm.

17. The method as recited in claim 11, further comprising forming a metal silicide layer over the trench contact, and the gate shield touches the metal silicide layer.

18. The method as recited in claim 17, wherein the silicide layer comprises titanium and the gate shield comprises aluminum.

19. The method as recited in claim 16, wherein the gate shield is formed to have a length equal to a length of the gate electrode plus or minus of about 0.1 µm to 0.2 µm.

20. The method as recited in claim 11, wherein the field relief dielectric layer is formed in a local oxidation of silicon (LOCOS) process creating the bird's beak adjacent to the drain region.

21. The method as recited in claim 11, further comprising forming a sidewall spacer on a sidewall of the gate electrode proximate to the source region, the sidewall spacer extending to the trench contact.

22. An integrated circuit, comprising:

a semiconductor substrate including an epitaxial layer, the epitaxial layer including a body region having a first conductivity type and a drain drift region having a second, opposite, conductivity type;

a gate dielectric layer over the body region and extending over a junction between the body region and the drain drift region;

a gate electrode over the gate dielectric layer;

a drain region having the second conductivity type in the drain drift region;

a field relief dielectric layer over the drain drift region, the field relief dielectric layer extending from the gate dielectric layer toward the drain region;

a source region having the second conductivity type in the body region;

a trench having a sidewall along the source region and extending below a junction between the source region and a body contact region; and a gate shield that extends along the sidewall into the trench and over at least a portion of the gate electrode.

23. An electronic device, comprising:

a source region and a drain region spaced apart along a semiconductor layer and having a first conductivity type;

a body region having an opposite second conductivity type extending from under the source region toward the drain region;

a dielectric layer on the semiconductor layer that extends between the source region and the drain region;

an electrode extending between the source region and the drain region on the dielectric layer;

a trench having a sidewall along the source region and extending below a junction between the source region and the body region; and a conductive layer that extends along the sidewall and over the electrode.

24. The electronic device of claim 23, further comprising a doped region having the first conductivity type that extends from the drain region toward the source region, wherein the conductive layer extends over the doped region.

25. The electronic device of claim 23, wherein the dielectric layer includes a first segment having a first thickness extending between the source and the drain, and a second segment having a greater second thickness extending from the first segment toward the drain, and the conductive layer extends over the second segment of the dielectric layer.

26. The electronic device of claim 25, wherein the segment includes a local oxidation of silicon (LOCOS) structure.

27. A method of forming an electronic device, comprising:

forming a source region and a drain region spaced apart along a semiconductor layer and having a first conductivity type;

forming a body region having an opposite second conductivity type extending from under the source region toward the drain region;

forming a dielectric layer on the semiconductor layer that extends between the source region and the drain region;

forming an electrode extending between the source region and the drain region on the dielectric layer;

forming a trench having a sidewall along the source region and extending below a junction between the source region and the body region; and forming a conductive layer that extends along the sidewall and over the electrode.

28. The method of claim 27, further comprising forming a doped region having the first conductivity type that extends from the drain region toward the source region, wherein the conductive layer extends over the doped region.

29. The method of claim 27, wherein the dielectric layer includes a first segment having a first thickness extending between the source and the drain, and a second segment having a greater second thickness extending from the first segment toward the drain, and the conductive layer extends over the second segment of the dielectric layer.

30. The method of claim 29, wherein the segment includes a local oxidation of silicon (LOCOS) structure.

\* \* \* \* \*